(12) United States Patent
Sugatani et al.

(10) Patent No.: US 7,414,278 B2
(45) Date of Patent: Aug. 19, 2008

(54) SEMICONDUCTOR DEVICE WITH SHALLOW TRENCH ISOLATION WHICH CONTROLS MECHANICAL STRESSES

(75) Inventors: Shinji Sugatani, Kawasaki (JP); Koichi Hashimoto, Kawasaki (JP); Yoshihiro Takao, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 168 days.

(21) Appl. No.: 11/017,828

(22) Filed: Dec. 22, 2004

(65) Prior Publication Data

US 2006/0022242 A1 Feb. 2, 2006

(30) Foreign Application Priority Data

Aug. 2, 2004 (JP) ............................. 2004-225308

(51) Int. Cl.
*H01L 27/108* (2006.01)
(52) U.S. Cl. ..................... 257/296; 257/68; 257/71; 257/298; 257/301; 257/304; 257/E27.084
(58) Field of Classification Search ................ 257/300, 257/301, 68, 71, 296, 298, 304
See application file for complete search history.

(56) References Cited

U.S. PATENT DOCUMENTS 6,573,548 B2 6/2003 Leung et al.
6,638,813 B1 10/2003 Tzeng et al.
2004/0129965 A1* 7/2004 Chen .......................... 257/301
2004/0137667 A1* 7/2004 Ogawa et al. ............... 438/142
2004/0212035 A1* 10/2004 Yeo et al. .................... 257/510

FOREIGN PATENT DOCUMENTS

CN 1507658 A 6/2004

OTHER PUBLICATIONS

Chinese Office Action dated Sep. 7, 2007 issued in corresponding Application No. 200510004566.2.

* cited by examiner

*Primary Examiner*—Wai-Sing Louie
(74) *Attorney, Agent, or Firm*—Westerman, Hattori, Daniels & Adrian, LLP.

(57) ABSTRACT

The semiconductor device comprises a semiconductor substrate 10 with a trench 16a and a trench 16b formed in; a device isolation film 32a buried in the trench 16a and including a liner film including a silicon nitride film 20 and an insulating film 28 of a silicon oxide-based insulating material; a device isolation film 32b buried in the bottom of the trench 16b; and a capacitor formed on a side wall of an upper part of the second trench 16b and including an impurity diffused region 40 as a first electrode, a capacitor dielectric film 43 of a silicon oxide-based insulating film and a second electrode 46.

4 Claims, 18 Drawing Sheets

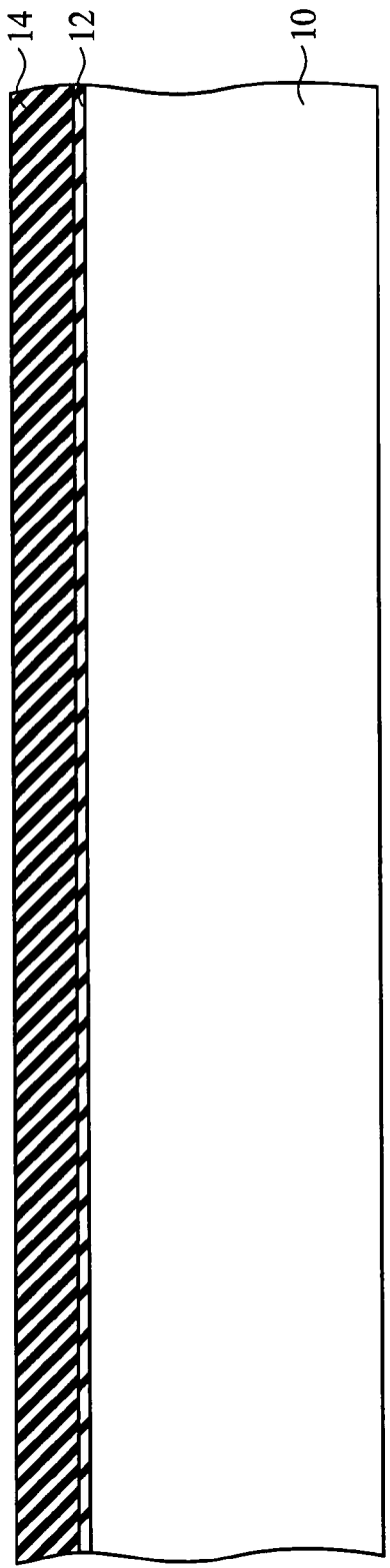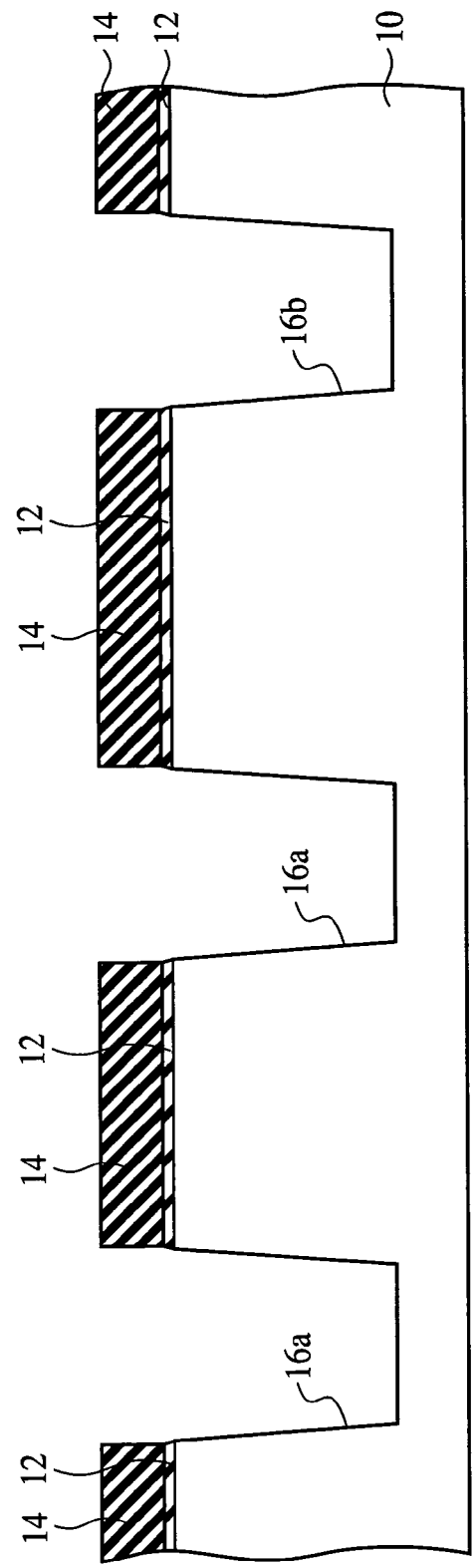

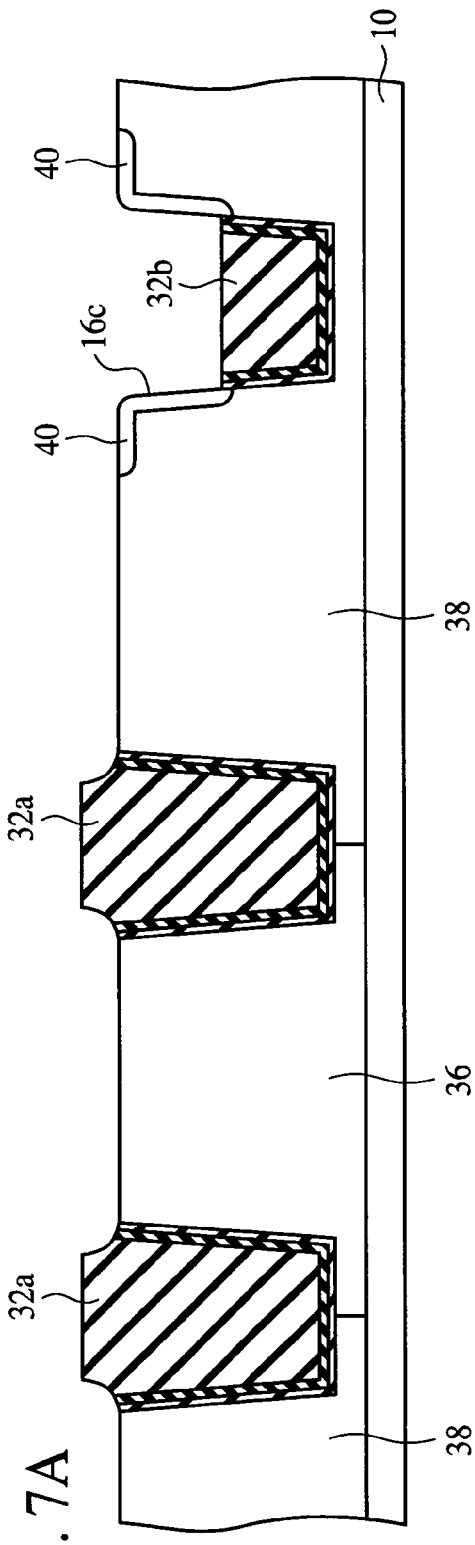
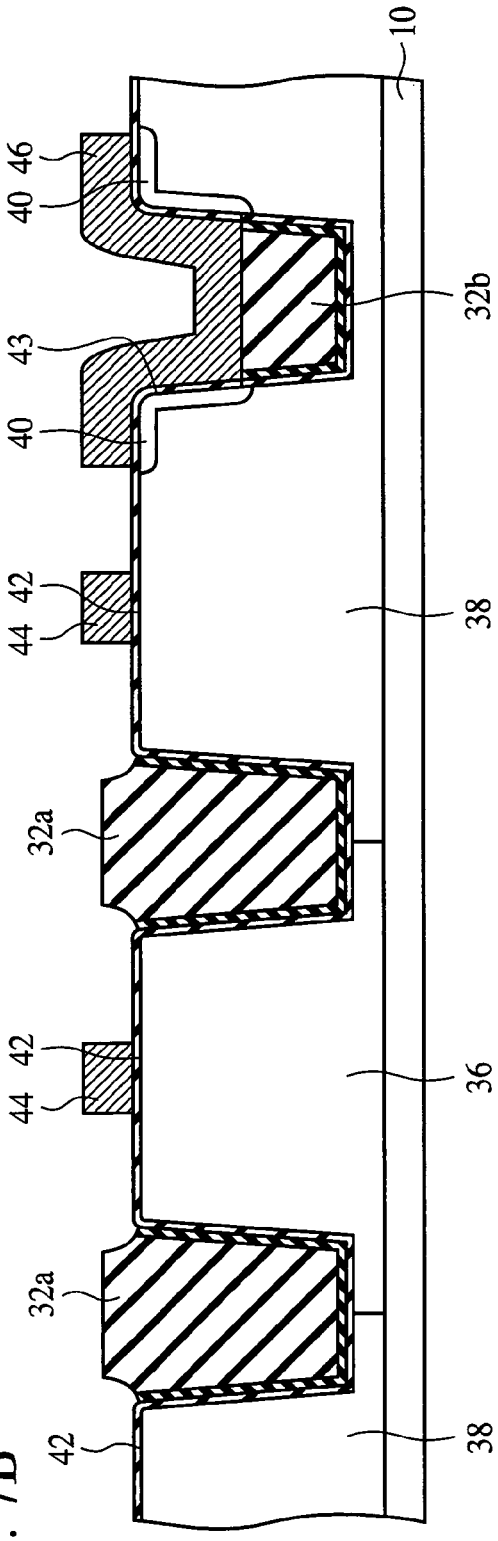
FIG. 7A
FIG. 7B

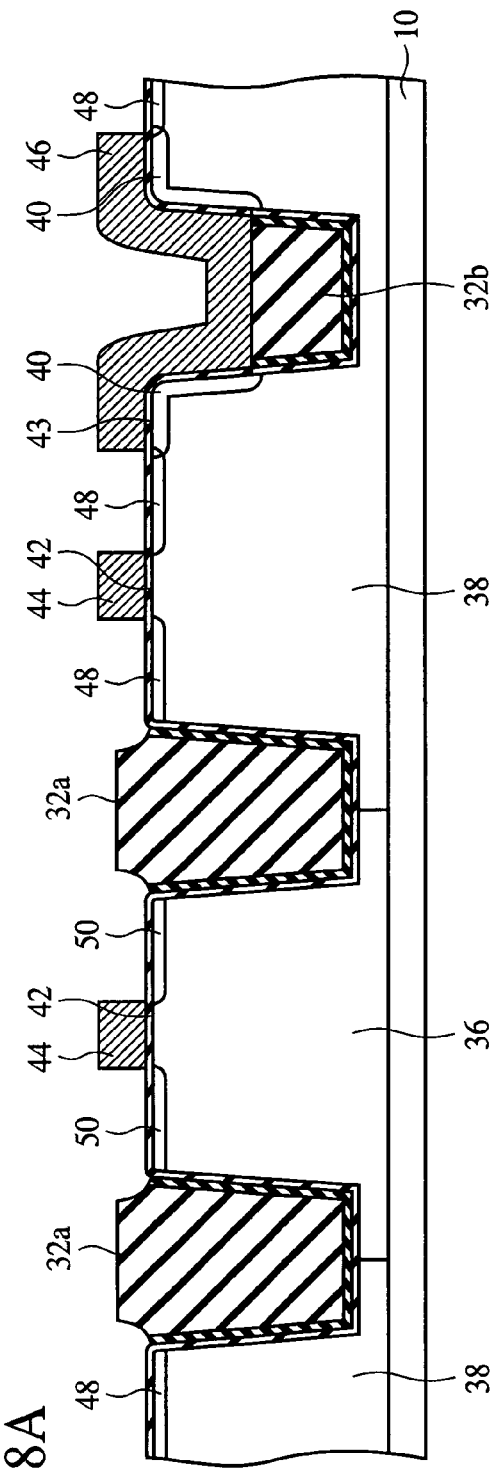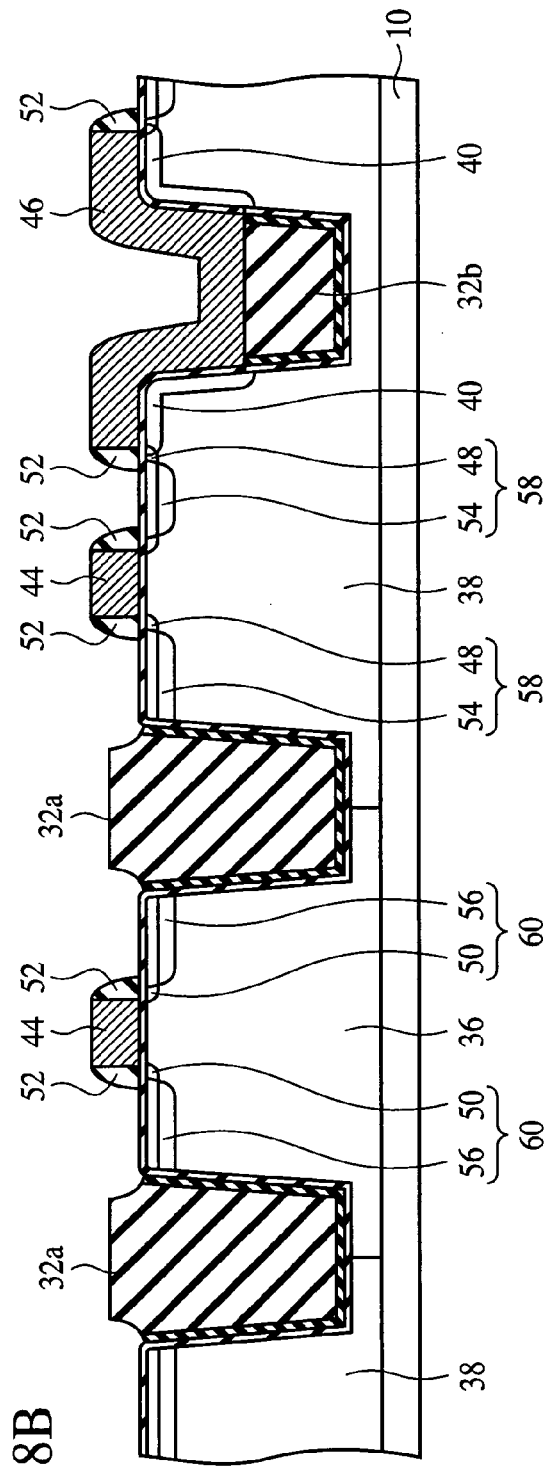

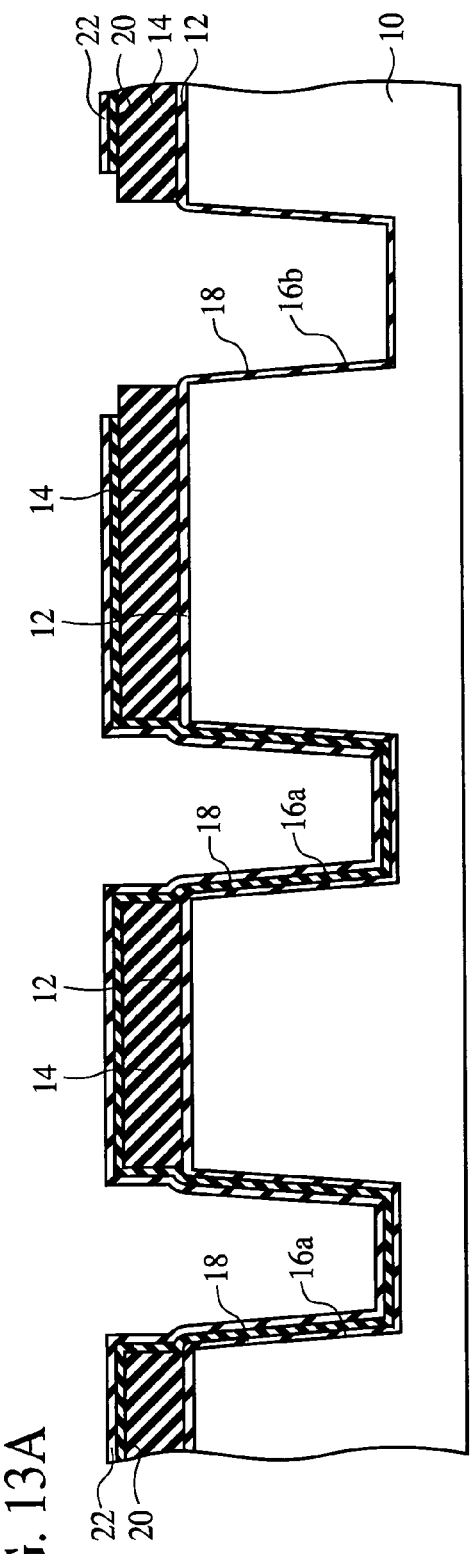
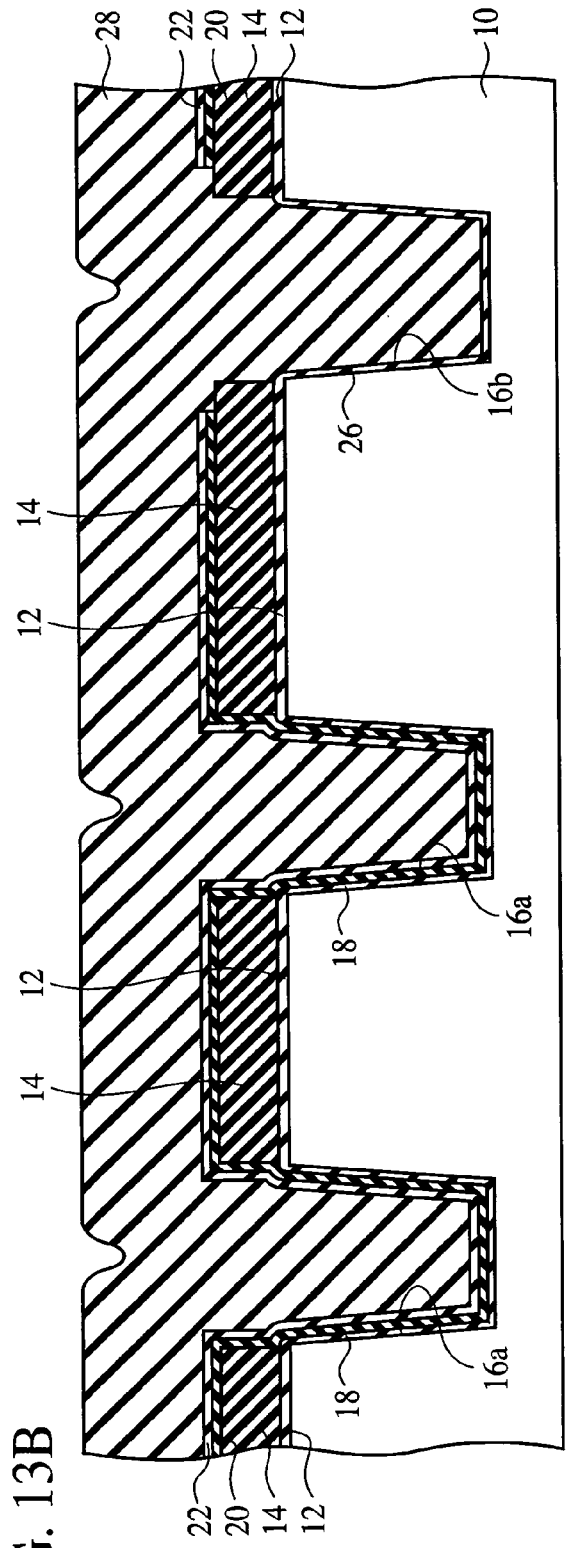
FIG. 13A
FIG. 13B

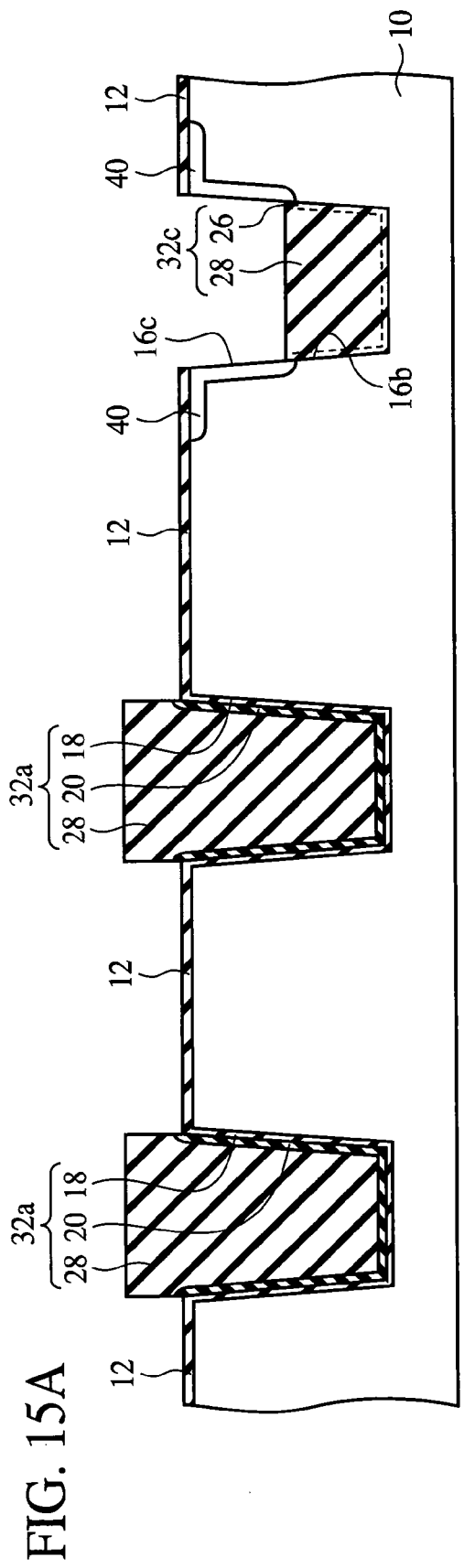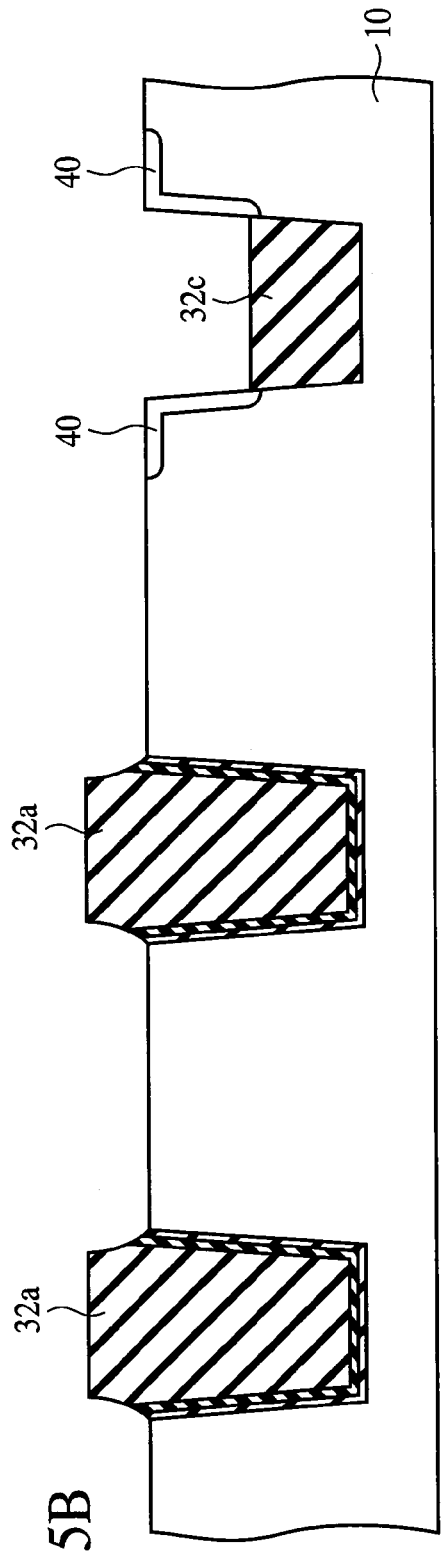
FIG. 15A
FIG. 15B

SEMICONDUCTOR DEVICE WITH SHALLOW TRENCH ISOLATION WHICH CONTROLS MECHANICAL STRESSES

CROSS-REFERENCE TO RELATED APPLICATIONS

This application is based upon and claims the benefit of priority from the prior Japanese Patent Application No. 2004-225308, filed on Aug. 2, 2004, the entire contents of which are incorporated herein by reference.

BACKGROUND OF THE INVENTION

The present invention relates to a semiconductor device and a method for fabricating the same, more specifically, a semiconductor device including memory elements each having 1 transistor and 1 capacitor which can be fabricated by the standard logic LSI process, and the method for fabricating the same.

Recently in integrating a semiconductor device, the capacity of a RAM (Random Access Memory) to be mounted is required to be larger. This is because mounting a RAM is effective means to increase the function per an area, to the end of decreasing the input/output circuit number to reduce the area for cost reduction and power consumption decrease, and to the end of integrating the RAM on one semiconductor substrate to thereby make the bandwidth of the memory large to increase processing capacity, and other ends.

To these ends is proposed a memory circuit comprising memory elements of the type that the memory element stores charges in the capacitor, the quantity of the charges is sensed by one access transistor, and binary information is stored, as in the conventional dynamic memory, which are formed with good compatibility with the fabrication process of a logic LSI, and whose refreshing operation, etc. are performed by an intelligent control circuit, whereby the memory circuit behaves as an SRAM to the outside.

Such the semiconductor devices are disclosed in, e.g., Reference 1 (Specification of U.S. Pat. No. 6,573,548) and Reference 2 (Specification of U.S. Pat. No. 6,638,813), etc.

SUMMARY OF THE INVENTION

An object of the present invention is to provide a semiconductor device and a method for fabricating the same which permits a logic LSI having a structure which can control the mechanical stress to be exerted by the trench isolation, and memory elements to be hybridized without degrading the characteristics of the memory elements.

According to one aspect of the present invention, there is provided a semiconductor device comprising: a semiconductor substrate with a first trench and a second trench formed in; a first device isolation film which includes a liner film formed along an inner surface of the first trench and including a silicon nitride film, and an insulating film of a silicon oxide-based insulating material buried in the first trench with the liner film formed in; a second device isolation film buried in a bottom of the second trench; and a capacitor formed on an upper part of a side wall of the second trench, which includes an impurity diffused region as a first electrode formed in the semiconductor substrate, a capacitor dielectric film of a silicon oxide-based insulating material formed on the side wall of the second trench, and a second electrode formed on the capacitor dielectric film.

According to another aspect of the present invention, there is provided a semiconductor device comprising: a semiconductor substrate with a first trench and a second trench formed in; a first device isolation film which includes a liner film formed along an inner surface of the first trench and including a silicon nitride film, and an insulating film of a silicon oxide-based insulating material buried in the first trench with the liner film formed in; a second device isolation film buried in a bottom of the second trench and formed of a silicon oxide-based insulating material; and a capacitor extended over the second device isolation film, which includes an impurity diffused region as a first electrode formed in the semiconductor substrate, a capacitor dielectric film formed on the impurity diffused region, and a second electrode formed on the capacitor dielectric film.

According to further another aspect of the present invention, there is provided a method for fabricating a semiconductor device comprising the steps of: forming a first trench and a second trench in a semiconductor substrate; forming a liner film including a silicon nitride film in the first trench and the second trench; burying a first insulating film in the first trench and the second trench to form a first device isolation film in the first trench and a second device isolation film in the second trench; removing an upper part of the second device isolation film formed in the second trench to expose a part of a side wall of the second trench; forming a capacitor dielectric film on the semiconductor substrate and the exposed sidewall of the second trench; and forming a capacitor electrode on the capacitor dielectric film.

According to the present invention, in the semiconductor device including the trench device isolation film having a silicon nitride film as a liner film for controlling the mechanical stress exerted by the device isolation film, the silicon nitride film as the liner film is not extended in the capacitor formed region, whereby the capacitance decrease due to the film thickness increase of the capacitor dielectric film can be prevented. The storage of charges in the capacitor dielectric film in the fabrication process can be prevented, whereby the capacitance of the capacitor can be stabilized.

The liner of the silicon nitride film is not left in the device isolation film in the capacitor formed region, whereby the leakage of charges between memory cells opposed to each other a cross the device isolation film can be effectively prevented. Thus, the inversion of stored information of such memory cells can be prevented.

Thus, in the semiconductor device including memory elements each having 1 transistor and 1 capacitor which can be fabricated by the standard logic LSI process, the semiconductor integrated circuit can have improved stored information retaining ability, and can have higher performances.

BRIEF DESCRIPTION OF THE DRAWINGS

FIGS. 2A-2B, 3A-3B, 4A-4B, 5A-5B, 6A-6B, 7A-7B, 8A-8B, and 9 are sectional views of the semiconductor devices according to the first embodiment of the present invention in the steps of the method for fabricating the same, which show the method.

FIGS. 12A-12B, 13A-13B, 14A-14B, and 15A-15B are sectional views of the semiconductor device according to the second embodiment of the present invention in the steps of the method for fabricating the same, which show the method.

DETAILED DESCRIPTION OF THE INVENTION

Figure 18:
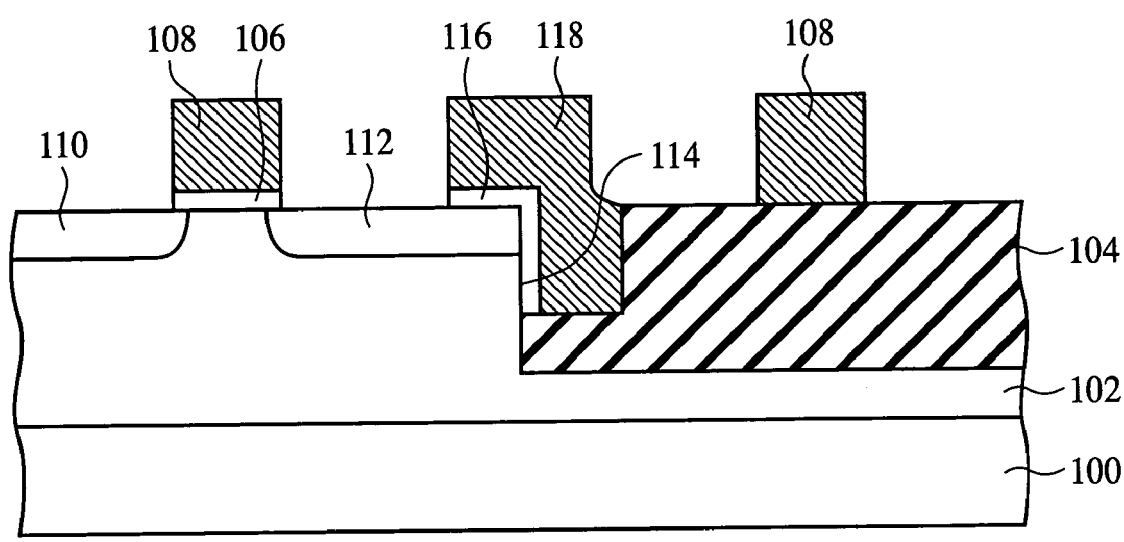
FIG. 18 is a diagrammatic sectional view of the conventional semiconductor device, which shows the structure thereof.

A conventional semiconductor device including such memory circuit will be explained with reference to FIG. 18. FIG. 18 is a diagrammatic sectional view of the structure of the conventional semiconductor device.

An n-well 102 is formed in a silicon substrate 100. In the surface side of the n-well 102, a device isolation film 104 for defining a device region is formed. In the device region defined by the device isolation film 104, an access transistor including a gate electrode 108 formed on the silicon substrate 100 with a gate insulating film 106 interposed therebetween, and source/drain diffused layers 110, 112 formed in the silicon substrate on both sides of the gate electrode 108 is formed.

The device isolation film 104 near the access transistor is recessed partially from the surface, forming a trench 114. A capacitor electrode 118 is formed on the side wall of the trench 114 and the source/drain diffused layer 112 with a capacitor dielectric film 116 interposed therebetween. Thus, a capacitor including the source/drain diffused layer 112 and the capacitor electrode 116 as a pair of electrodes is constituted.

The memory cell shown in FIG. 18 is characterized in that the memory cell can be fabricated by the standard logic LSI process and, suitably for higher densities, has a bit cell size which is about ¼ of that of the universal 6-transistor SRAM.

In the logic LSI, as a countermeasure to changes of characteristics of the elements due to mechanical stress applied by the device isolation, etc., it is proposed that the device isolation have a structure which can control the mechanical stress to be exerted by the trench isolation. Thus, in order to hybridize the logic LSI and the 1-transistor/1-capacitor type memory described above, it is necessary to use a trench isolation structure having the mechanical stress controlled.

A First Embodiment

The semiconductor device and the method for fabricating the same according to a first embodiment of the present invention will be explained with reference to FIGS. 1 to 9.

Figure 1:
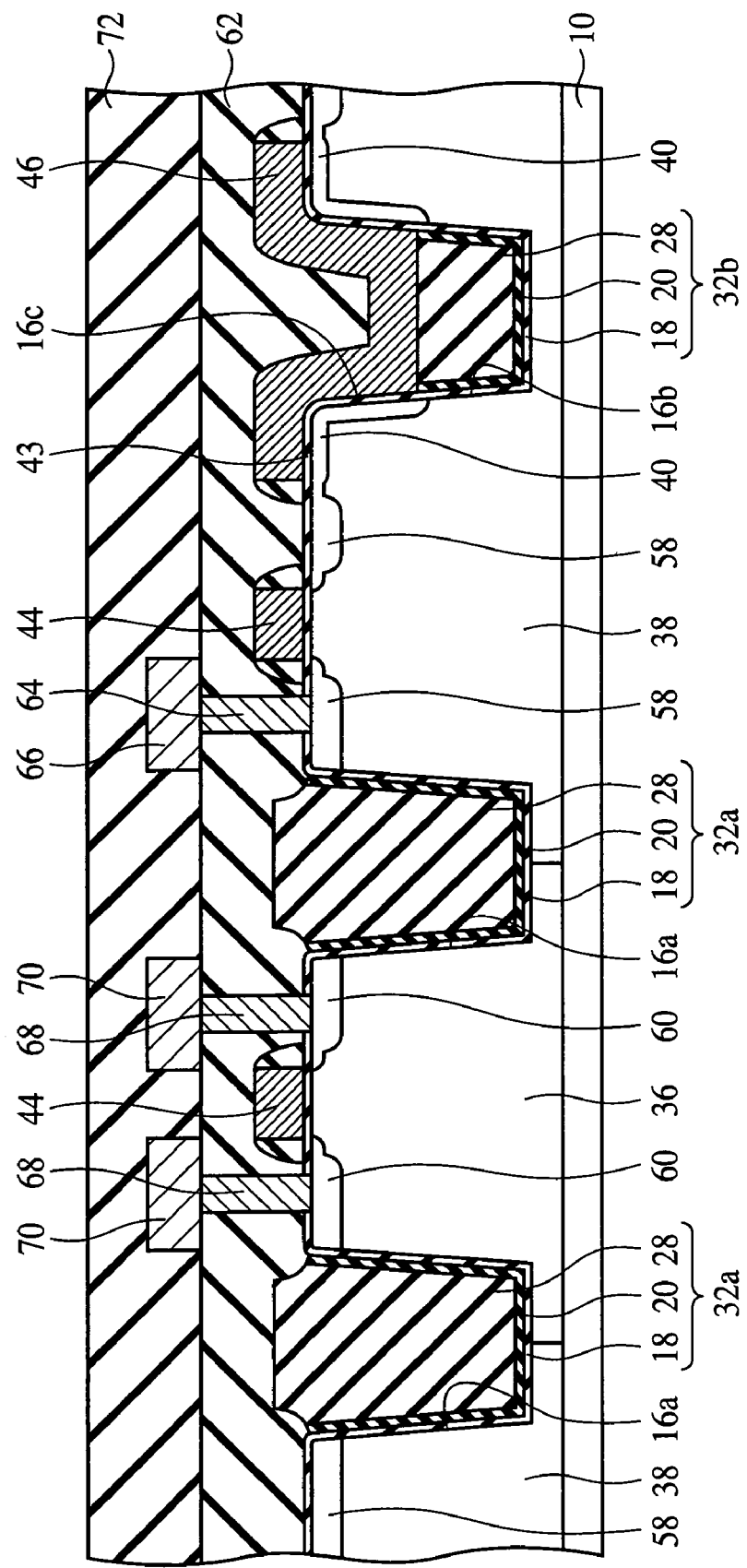
FIG. 1 is a diagrammatic sectional view of the semiconductor device according to a first embodiment of the present invention, which shows a structure thereof.

FIG. 1 is a diagrammatic sectional view of the semiconductor device according to the present embodiment, which shows a structure thereof. FIGS. 2A to 9 are sectional views of the semiconductor device according to the present embodiment in the steps of the method for fabricating the semiconductor device, which show the method.

First, the structure of the semiconductor device according to the present embodiment will be explained with reference to FIG. 1.

In the silicon substrate 10, trenches 16a, 16b for the device isolation are formed. The trenches 16a are formed in the usual device isolation regions, and the trenches 16b are formed in the region where the capacitors of memory cells are formed. In FIG. 1, the region on the right side of the central trench 16a is a memory cell region, and the region on the left side of the central trench 16a is a peripheral circuit region.

In the trenches 16a, 16b, a liner film of a silicon oxide film 18 and a silicon nitride film 20, and a silicon oxide film 28 are buried, and device isolation films 32a, 32b formed of these films are formed. The device isolation film 32b is partially removed on the side of the surface of the silicon substrate 10, and a trench 16c is left on the device isolation film 32b.

In the specification, the liner film means a film formed along the inside surface (inside wall and the bottom surface) of the trenches.

The device region between the device isolation film 32a on the left side and the device isolation film 32a at the center is the region where an n-channel transistor of the peripheral circuit is formed, and a p-well 36 is formed there. The active region on the left side of the left device isolation film 32a is the region where a p-channel transistor of the peripheral circuit is formed, and an n-well 38 is formed there. The device region on the right side of the central device isolation film 32a is a memory cell region where a p-channel transistor as an access transistor is formed, and an n-well 38 is formed there.

In the memory cell region, a memory cell comprising an access transistor including a gate electrode 44 and source/drain diffused layers 58, and a capacitor including a pair of electrodes formed of an impurity diffused region and a capacitor electrode are formed. The impurity diffused region 40 forming the lower electrode of the capacitor is formed over from the inside wall of the trench 16c and the surface of the silicon substrate 10 and is connected to one side of the source/drain diffused layer 58 of the access transistor. On the impurity diffused layer 40, the capacitor electrode 46 is formed with a capacitor dielectric film 43 interposed therebetween. The capacitor electrode 46 is extended from the inside of the trench 16c onto the surface of the silicon substrate 10.

In the n-channel transistor formed region, an n-channel transistor including a gate electrode 44 and source/drain diffused layers 60 is formed. In the p-channel transistor formed region, a p-channel transistor (not shown) is formed.

An inter-layer insulating film 62 is formed on the silicon substrate 10 with the memory cell and the peripheral circuit transistors formed on. On the inter-layer insulating film 62, a bit line 66 electrically connected to the other side of the source/drain diffused layer 60 of the access transistor via a contact plug 64, an interconnection layer 70 electrically connected to the source/drain diffused layers 60 of the n-channel transistor via contact plugs 68, etc. are formed. An inter-layer insulating film 72 is formed on the inter-layer insulating film 62 with the bit line 66, the interconnection layer 70, etc. formed on.

As shown in FIG. 1, one characteristic of the semiconductor device according to the present embodiment is that the device isolation films 32a, 32b buried in the trenches 16a, 16b are formed of the liner film of the silicon oxide film 18 and the silicon nitride film 20, and the silicon oxide film 28.

This characteristic of the device isolation films 32a, 32b is for controlling the mechanical stress to be exerted by the device isolation film. That is, the silicon oxide film 28, which is usually used in filling trenches, has compression stress, but the compression stress of the silicon oxide film 28 is largely mitigated by laying below the silicon oxide film 28 the silicon nitride film 20, which has tensile stress, whereby the stress to be exerted to the silicon substrate 10 can be suppressed. The silicon nitride film 20 also has the effect of pulling the channel part to increase the mobility of the carriers. Accordingly, the stress to be exerted to the device isolation film is suitably controlled to thereby improve the device characteristics.

In forming the capacitor on the device isolation film 32b, when the silicon nitride film 20 as the liner film remains between the capacitor electrodes, the film thickness of the capacitor dielectric film is increased, and the storage capacitance is decreased. Also, charges stored in the interface between the silicon nitride film and the silicon oxide film in the fabrication process vary a charge quantity to be stored. Then, in the semiconductor device according to the present embodiment, the silicon nitride film 20 as the liner film between the capacitor electrodes does not remain.

Such structure of the semiconductor device can suppress the characteristic degradation of the memory cell even in the case that the device isolation structure of the logic LSI for mitigating the mechanical stress of the trench device isolation is applied.

Next, the method for fabricating the semiconductor device according to the present embodiment will be explained with reference to FIGS. 2A to 9.

First, the silicon substrate 10 is thermally oxidized to form a silicon oxide film 12 of, e.g., a 10 nm-thick.

Next, a silicon nitride film of, e.g., a 100 nm-thick is formed on the silicon oxide film 12 by, e.g., CVD method (FIG. 2A).

Next, a photoresist film (not shown) exposing the device isolation regions (including the region for the capacitor to be formed in) and covering the rest region is formed.

Then, with the photoresist film as the mask, the silicon nitride film 14, the silicon oxide film 12 and the silicon substrate 10 are dry etched. Thus, the trenches 16a, 16b of, e.g. a 300 nm-depth are formed in the silicon substrate 10 (FIG. 2B). In the drawings of FIG. 2B and the followers, the region on the right side of the central trench 16a is the memory cell region, and the region on the left side of the central trench 16a is the peripheral circuit region. The trenches 16a are usual device isolation trenches, and the trench 16b is a device isolation trench in the region where the capacitor is to be formed.

Figure 3A:
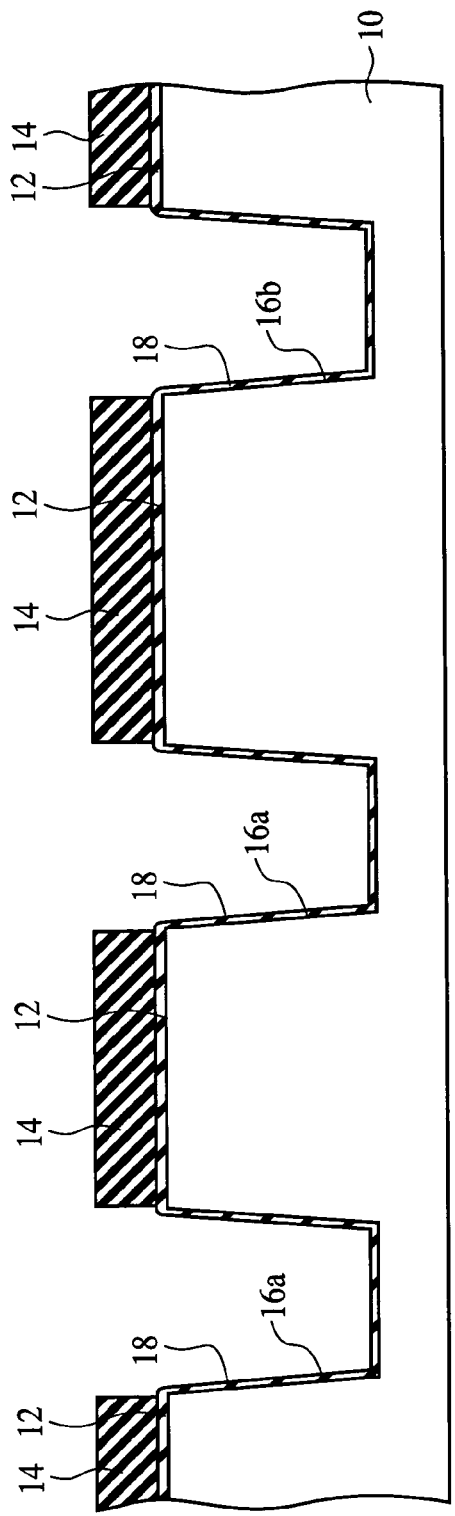

Then, with the silicon nitride film 14 as the mask, the silicon substrate 10 is thermally oxidized to form the silicon oxide film 18 of, e.g., a 5 nm-thick on the inside walls of the trenches 16a, 16b (FIG. 3A). In place of the silicon oxide film 18, an insulating film, such as silicon oxynitride film or other silicon oxide-based insulating films may be used.

This thermal oxidation is for recovering damages by the etching in forming the trenches 16a, 16b. The device isolation film having the structure for controlling the mechanical stress as in the present embodiment varies the effect of the stress control, depending on the film thickness of the silicon oxide film. Usually, as the film thickness is smaller, the effect is higher, and the film thickness of, e.g., 5 nm is suitable.

Figure 3B:
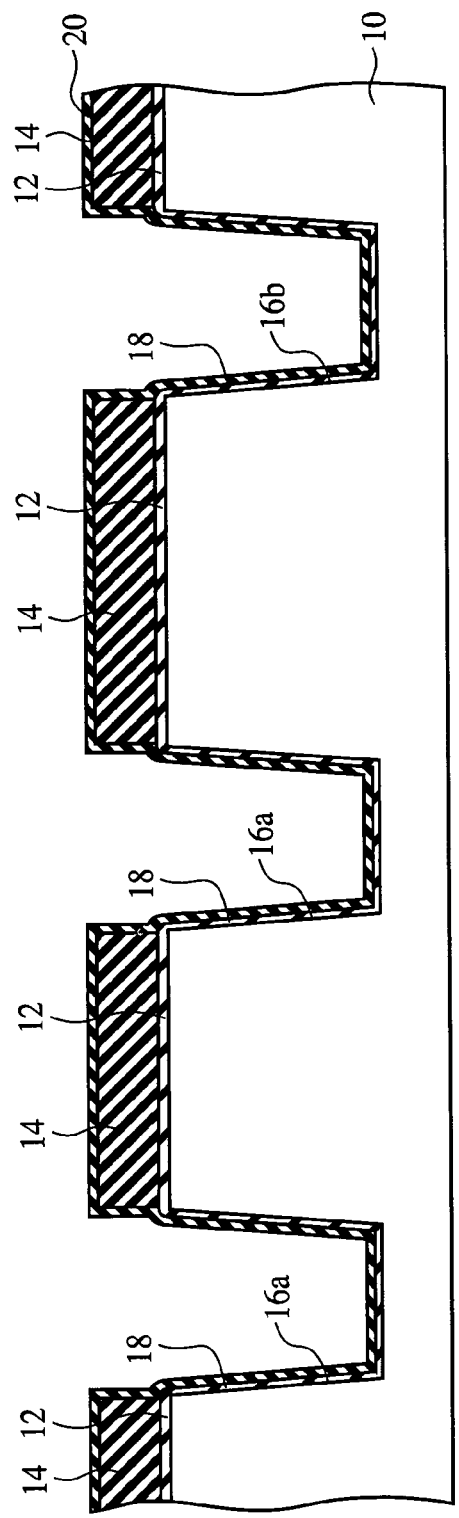

Next, the silicon nitride film 20 of, e.g., a 10 nm-thick is formed by, e.g., CVD method (FIG. 3B). The silicon nitride film 20, which has tensile stress, has the effect of pulling the channel part to thereby increase the carrier mobility.

Figure 4A:
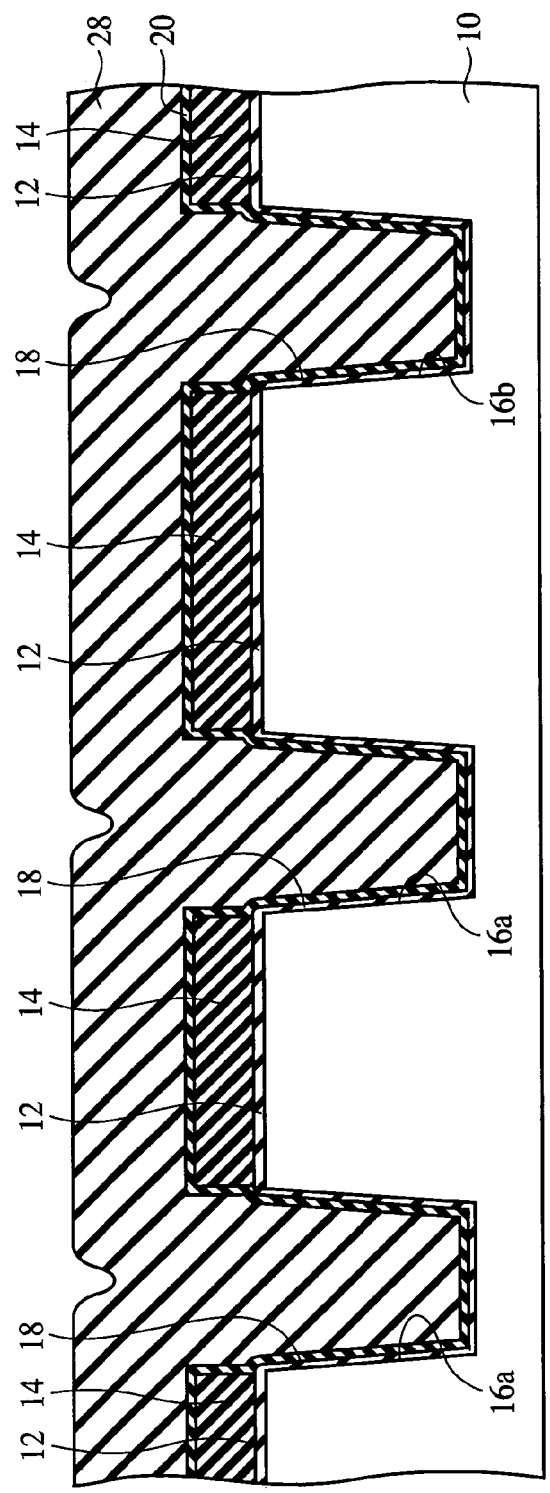

Then, the silicon oxide film 28 of, e.g., a 500 nm-thick is deposited by, e.g., CVD method (FIG. 4A). In place of the silicon oxide film 28, a silicon oxide-based insulating film, such as silicon oxynitride film or others, may be used.

Thus, the trenches 16a, 16b are completely filled with the silicon oxide film 28. The silicon oxide film 28 has compression stress, but the silicon nitride film 20 having tensile stress is laid below the silicon oxide film 28. Thus, the compression stress of the silicon oxide film 28 is largely mitigated, and the stress to be exerted to the silicon substrate 10 is suppressed.

Figure 4B:
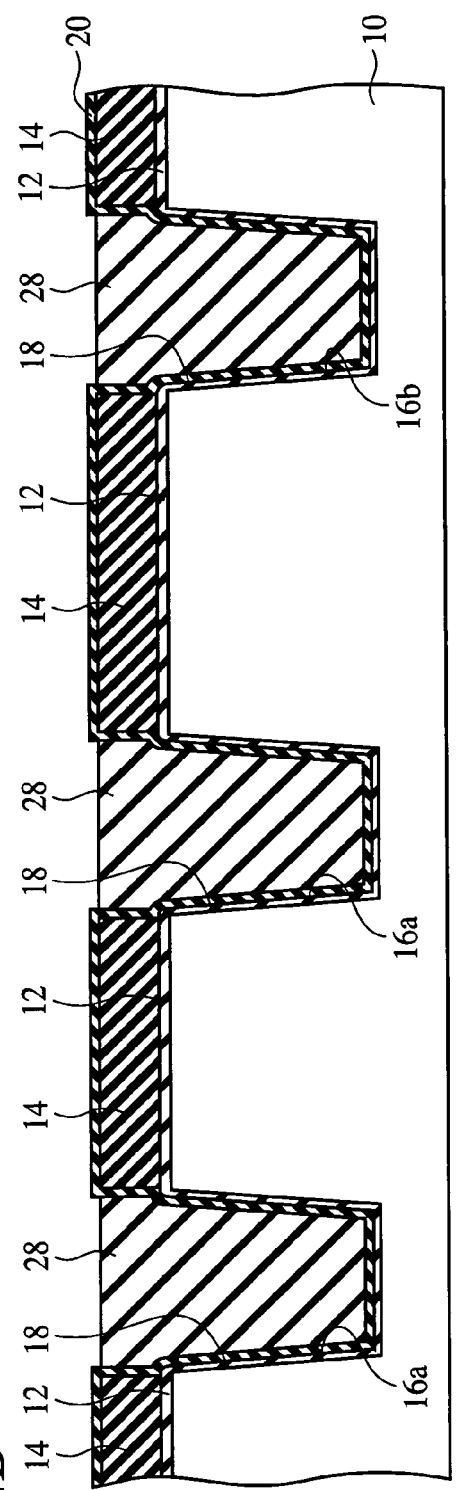

Then, the silicon oxide film 28 on the silicon nitride film 20 is removed by, e.g., CMP method or RIE method (FIG. 4B).

Then, thermal processing is performed in a nitrogen atmosphere at, e.g., 1000° C. for 30 seconds to thereby increase the film density of the silicon oxide film 28 buried in the trenches 16a, 16b. This thermal processing may be performed before the step of removing the silicon oxide film 28 on the silicon nitride film 20.

Next, a photoresist film exposing the device isolation region where the capacitor is to be formed is formed by photolithography.

Figure 5A:
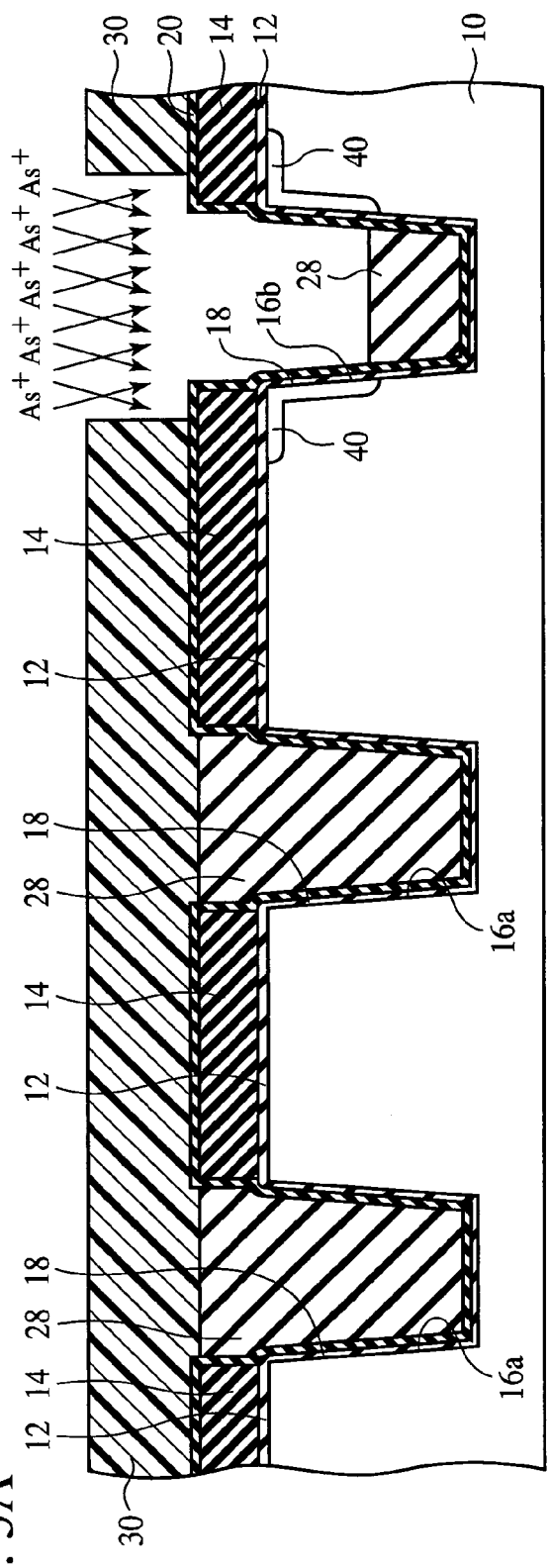

Next, with the photoresist film 30 as the mask and the silicon nitride film 20 as the stopper, the silicon oxide film 28 is etched to remove a part of the silicon oxide film buried in the trench 16b (FIG. 5A). Preferably, the film thickness of the silicon oxide film left in the trench 16b is suitably controlled in accordance with the isolation characteristics between the adjacent memory cells.

Then, with the photoresist film 30 as the mask, ion implantation is performed to form the impurity diffused region 40 to be the lower electrode of the capacitor in the silicon substrate 10 in the region for the capacitor to be formed in. In the impurity diffused regions 40, the ion implantation is performed in at least 2 directions tilted by 20 or more to the normal to the substrate under conditions of, e.g., $B^+$, 10 keV and a $8 \times 10^{12}$ cm$^{-2}$ dosage. The ion implantation can be thus performed sufficiently in the surface of the silicon substrate 10 and also in a part of the side walls of the trench 16b, which are in the region not covered by the photoresist film 30.

The impurity diffused region 40 are formed by using the photoresist film 30, which makes it unnecessary to additionally use photolithography for forming the impurity diffused region 40. In this term, the method for fabricating the semiconductor device according to the present embodiment can simplify the fabrication process.

Figure 5B:
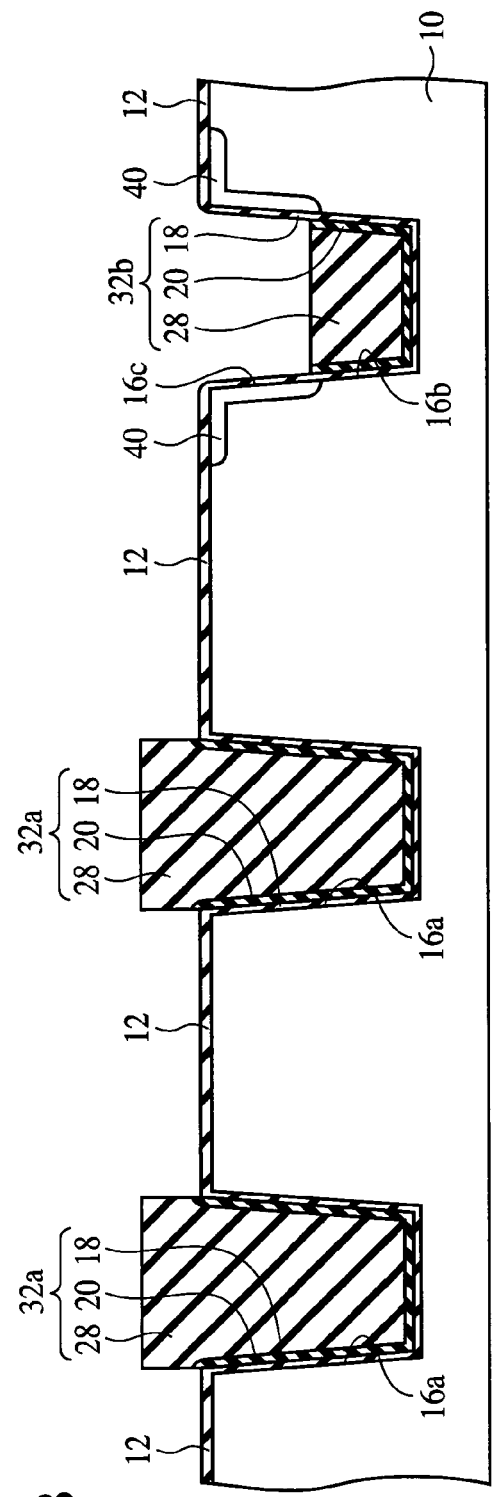

Then, after the photoresist film 30 has been removed, the silicon nitride films 20, 14 are removed by, e.g., boiled phosphoric acid. Thus, in the trenches 16a, the device isolation film 32a of the silicon oxide film 18, the silicon nitride film 20 and the silicon oxide film 28 is formed. Also in the trench 16b, the device isolation film 32b of the silicon oxide film 18, the silicon nitride film 20 and the silicon oxide film 28 is formed, and the trench 16c is left on the device isolation film 32b (FIG. 5B).

The film thickness of the silicon nitride film 20 is set at about 10 nm, whereby the silicon nitride film between the silicon oxide film 28 and the silicon oxide film 18 is prevented from being excessively etched.

Figure 6A:
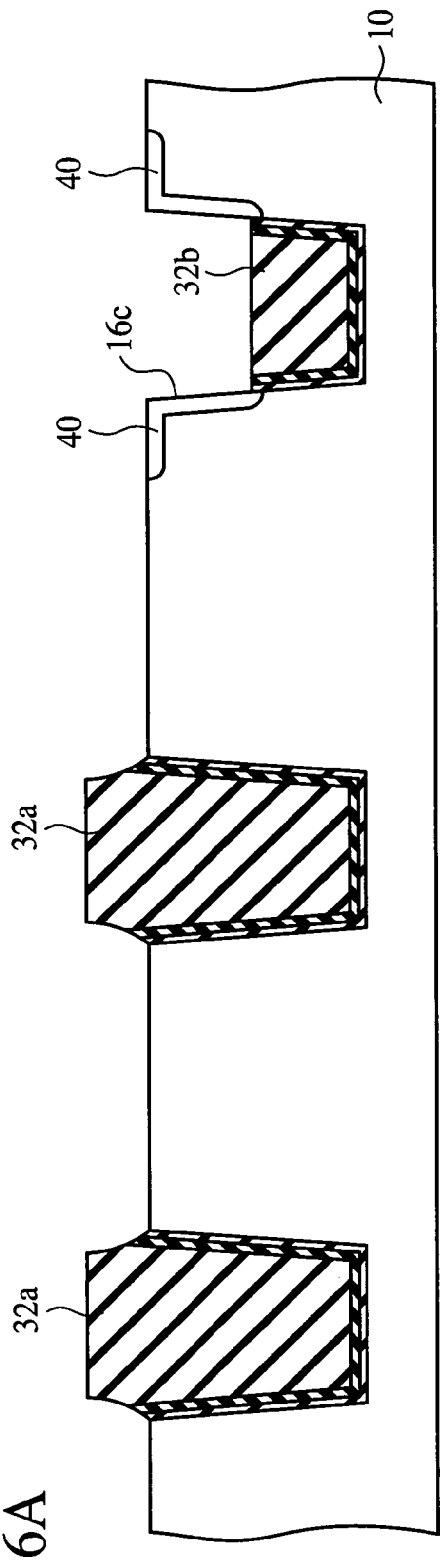

Then, the silicon oxide films 12, 18 are wet etched with a hydrofluoric acid-based aqueous solution to thereby expose the surface of the silicon substrate in the device region and the inside wall of the trench 16c (FIG. 6A).

In this etching, the film thickness of the device isolation film 32a, 32b is reduced. The film thickness of the silicon oxide film 18 is set at about 5 nm, whereby the silicon oxide film 18 between the silicon nitride film 20 and the silicon substrate 10 is prevented from being excessively etched.

Then, a sacrificial oxidation film 34 of a silicon oxide film of, e.g., a 10 nm-thick is formed by thermal oxidation on the surface of the silicon substrate 10 and the inside wall of the trench 16c.

Figure 6B:
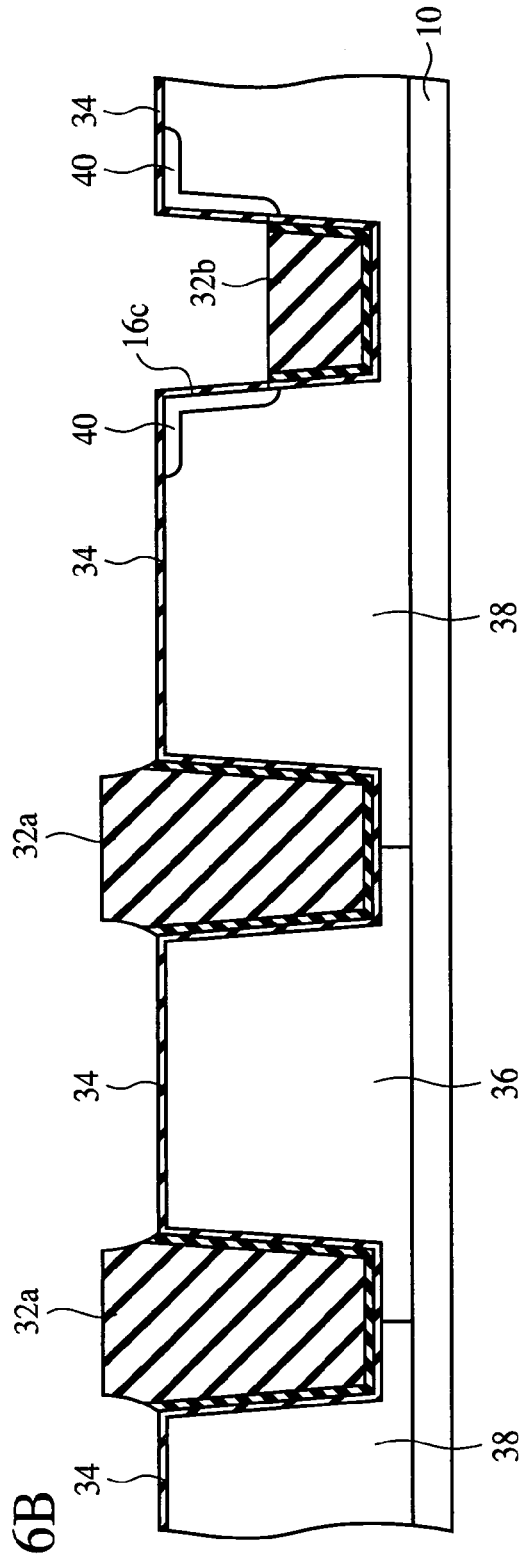

Next, ion implantation is performed in prescribed regions of the silicon substrate 10 to thereby form the p-well 36 and the n-wells 38 (FIG. 6B). In FIG. 6B, the region on the left of the left device isolation film 32a is the region for the p-channel transistor to be formed in, and the n-well 38 is to be formed there. The region between the left device isolation film 32a and the central device isolation film 32a is the region for the n-channel transistor to be formed in, and the p-well 36 is formed there. The region on the right side of the central device isolation film 32a is the region where the memory cell having the p-channel transistor as the access transistor is to be formed, and the n-well 38 is formed there.

The p-well 36 is formed by well ion implantation under conditions of, e.g., B$^+$, 150 keV acceleration energy and 3×10$^{13}$ cm$^{-2}$ dosage, and by channel ion implantation under conditions of, e.g., B$^+$, 10 keV acceleration energy and 8×10$^{12}$ cm$^{-2}$ dosage. The n-wells 38 are formed by well ion implantation under conditions of, e.g., P$^+$, 300 keV acceleration energy and 3×10$^{13}$ cm$^{-2}$ dosage, and by channel ion implantation under conditions of, e.g., As$^+$, 100 keV acceleration energy and 8×10$^{12}$ cm$^{-2}$ dosage.

Then, the sacrificial oxidation film 34 is etched by wet etching using a hydrofluoric acid-based aqueous solution to expose the surface of the silicon substrate 10 in the device region and the inside wall of the trench 16c (FIG. 6A). In this etching, the film thickness of the device isolation film 32a, 32b is reduced.

Next, a hydrogen treatment is performed in, e.g., a hydrogen atmospheric pressure of 100 Torr or below at a 900-1050° C. heating temperature and for about 10 seconds of the processing period of time. This treatment flattens the surface of the silicon substrate 10 and rounds the upper corners of the trench 16c (FIG. 7A).

Then, a silicon oxide film of, e.g., a 3 nm-thick is formed by thermal oxidation. Thus, the gate insulating film 42 of the silicon oxide film is formed on the device region. The gate insulating film 42 is to be the capacitor dielectric film 43 near the trench 16c. In place of the silicon oxide film, another insulating film, such as silicon oxynitride film or others, may be used. The gate insulating film 42 and the capacitor dielectric film 43 may not be essentially the same film. The capacitor dielectric film 43 and the gate insulating film 42 may be formed separately respectively in, e.g., a 3 nm-thick and a 2 nm-thick.

Then, a polycrystalline silicon film of, e.g., a 150 nm-thick is formed on the gate insulating film 42 by, e.g., CVD method.

Next, the polycrystalline silicon film is patterned by lithography and dry etching to form the gate electrodes 44 and the capacitor electrode 46 of the polycrystalline silicon film (FIG. 7B).

Then, with the gate electrodes 44 and the capacitor electrode 46 as the mask, ion implantation is performed to form in the silicon substrate 10 the impurity diffused regions 48, 50 to be the LDD regions (FIG. 8A). The impurity diffused regions 48 for the p-channel transistor are formed by ion implantation performed under conditions of, e.g., B$^+$, 0.5 keV acceleration energy and 1×10$^{15}$ cm$^{-2}$ dosage. The impurity diffused regions 50 for the n-channel transistors are formed by ion implantation performed under conditions of, e.g., As$^+$, 5 keV acceleration energy and 1×10$^{15}$ cm$^{-2}$ dosage.

Then, a silicon oxide film of, e.g., a 100 nm-thick is deposited by, e.g., CVD method and then etched back to form the sidewall insulating film 52 on the side walls of the gate electrodes 44 and the capacitor electrode 46.

Next, ion implantation is performed with the gate electrodes 44, the capacitor electrode 46 and the sidewall insulating film 52 as the mask to form in the silicon substrate 10 the impurity diffused regions 54, 56. The impurity diffused regions 54 for the p-channel transistors are formed by ion implantation under conditions of, e.g., B$^+$, 5 keV acceleration energy and 2×10$^{15}$ cm$^{-2}$ dosage. The impurity diffused regions 56 for the n-channel transistors are formed by ion implantation under conditions of, e.g., P$^+$, 10 keV acceleration energy and 2×10$^{15}$ cm$^{-2}$ dosage.

Then, thermal treatment is performed to activate the implanted impurities to form the source/drain diffused layers 58 for the p-channel transistors formed of the impurity diffused regions 48, 54, and the source/drain diffused layers 60 for the n-channel transistors formed of the impurity diffused regions 50, 56.

Thus, the p-channel transistors including the gate electrode 44 and the source/drain diffused layers 58, the n-channel transistors including the gate electrode 44 and the source/drain diffused layers 60, the capacitors including the impurity diffused region 40 and the capacitor electrode 46, etc. are formed on the silicon substrate 10 (FIG. 6B).

Then, the inter-layer insulating film 62 is formed on the silicon substrate 10 with the n-channel transistors, the p-channel transistors, the capacitors, etc. formed on.

Next, in the same way as in the usual interconnection forming process, the bit lines 66 electrically connected to the source/drain diffused layer 58 of the memory cell transistor via the contact plug 64, and the interconnection layers 70 electrically connected to the source/drain diffused layer 60 of the n-channel transistor via the contact plug, etc. are formed.

Figure 9:
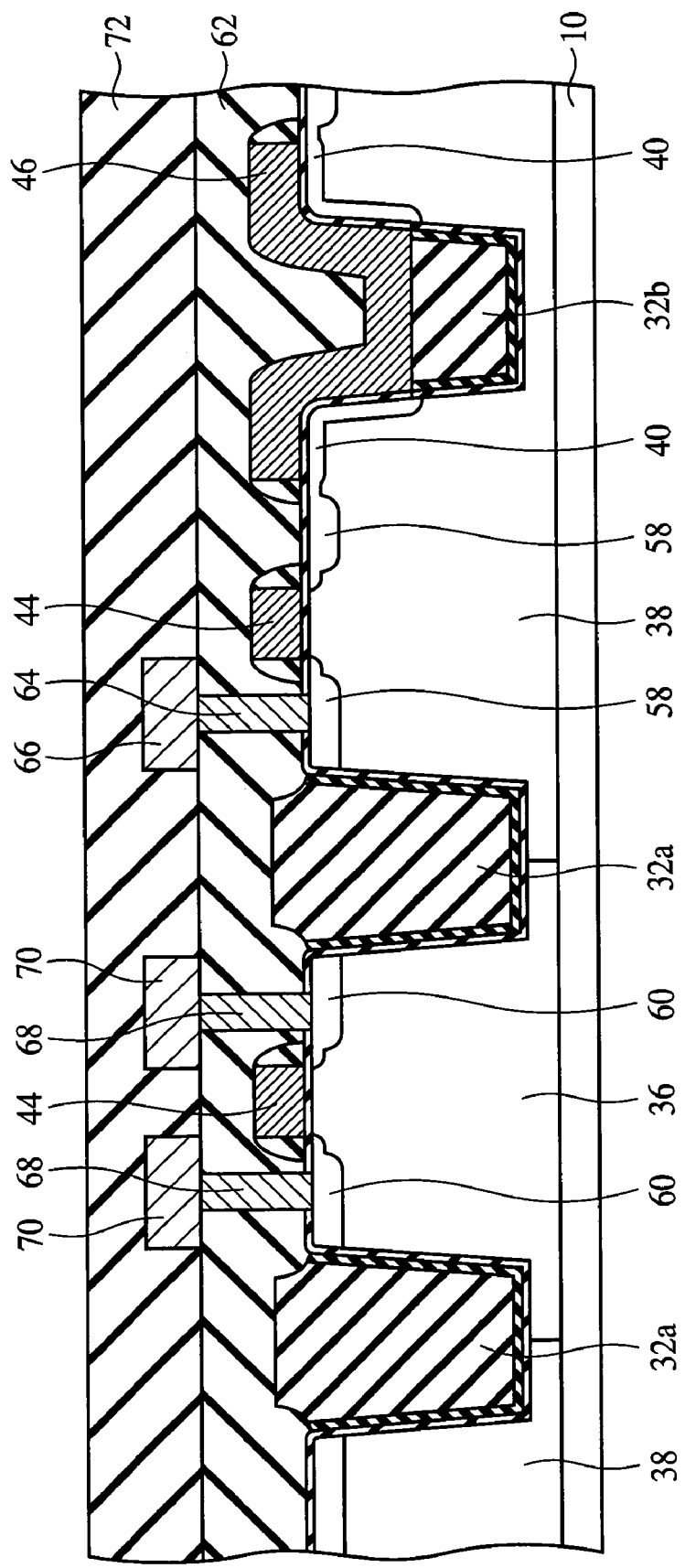

Next, the inter-layer insulating film 72 is formed on the inter-layer insulating film 62 with the bit lines 66, the interconnection layers 70, etc. formed on (FIG. 9).

Then, a plurality of interconnection layers, a plurality of inter-layer insulating films, a cover insulating film, etc. are formed as required, and the semiconductor device is completed.

As described above, the semiconductor device according to the present embodiment, in which the trench device isolation film includes a silicon nitride film as the liner film to thereby control the mechanical stress exerted by the device isolation film, the silicon nitride film as the liner film is formed, not extended in the capacitor formed region, whereby the capacitance decrease due to the film thickness increase of the capacitor dielectric film can be prevented. The storage of charges in the capacitor dielectric film during the fabrication process can be prevented, whereby the capacitance of the capacitor can be stabilized.

The above-described structure can be realized without making large changes and increases to the fabrication step number of the semiconductor device, whereby increases of the fabrication cost and product costs can be suppressed.

A Second Embodiment

The semiconductor device and the method for fabricating the same according to a second embodiment of the present invention will be explained with reference to FIGS. 10 to 15B. The same members of the present invention as those of the semiconductor device and the method for fabricating the same according to the first embodiment shown in FIGS. 1 to 9 are represented by the same reference numbers not to repeat or to simplify their explanation.

Figure 10:
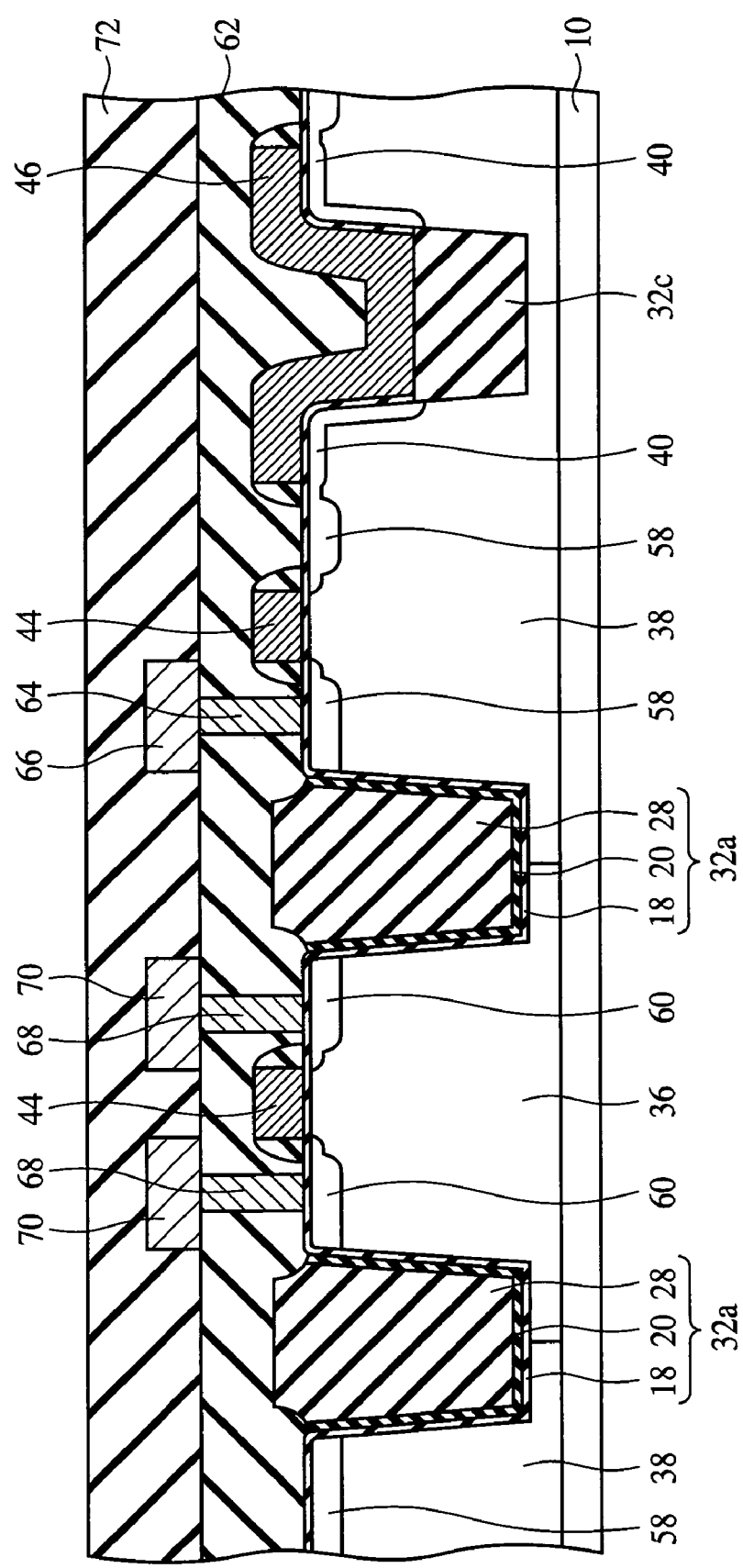
FIG. 10 is a diagrammatic sectional view of the semiconductor device according to a second embodiment of the present invention, which shows the structure thereof.
Figure 11:
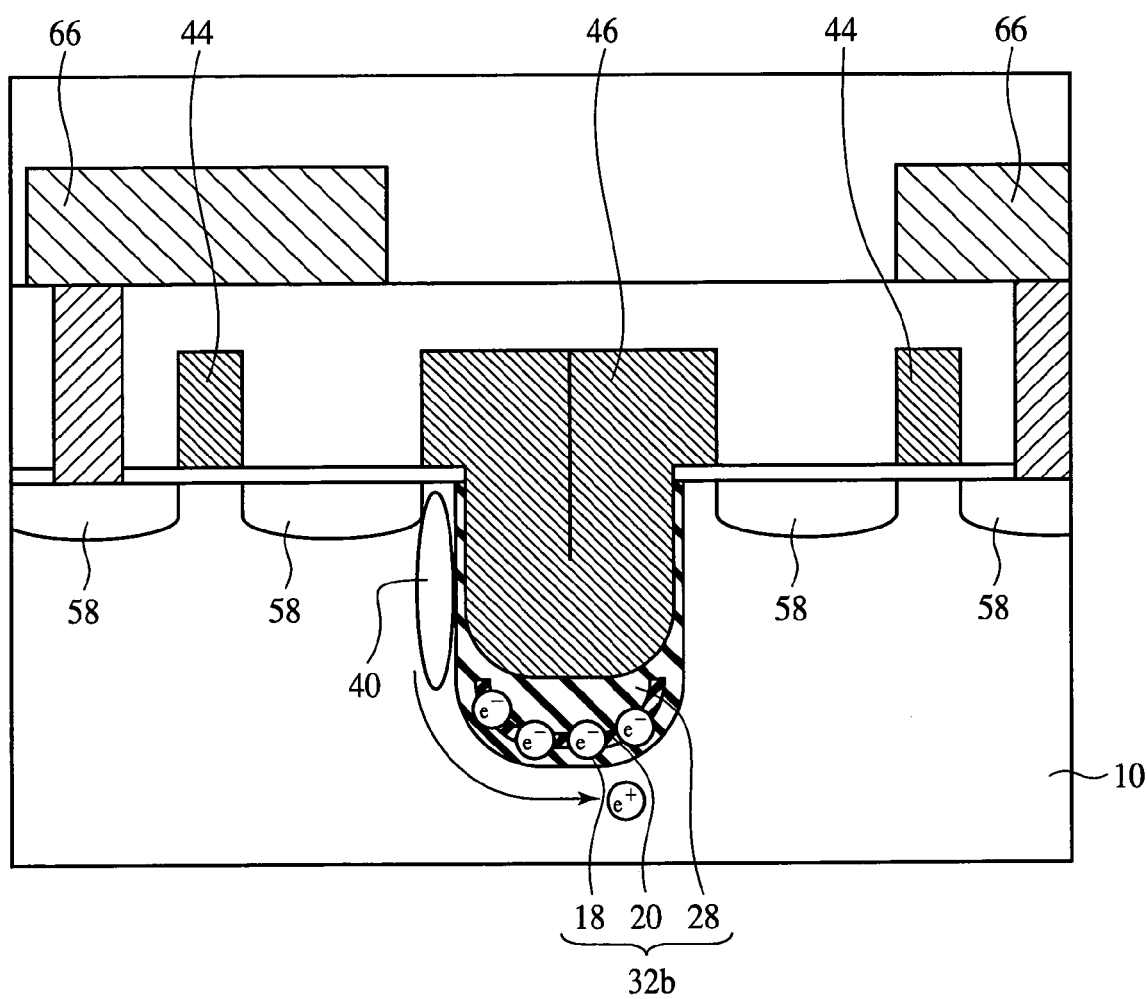
FIG. 11 is a view explaining the problem of the semiconductor device according to the first embodiment of the present invention.

FIG. 10 is a diagrammatic sectional view of the semiconductor device according to the present embodiment, which shows a structure thereof. FIG. 11 is a view explaining the problem of the semiconductor device according to the fist embodiment. FIGS. 12A to 15B are sectional views of the semiconductor device according to the present embodiment in the steps of the method for fabricating the same, which show the method.

First, the structure of the semiconductor device according to the present embodiment will be explained with reference to FIG. 10.

As shown in FIG. 10, the semiconductor device according to the present embodiment is the same as the semiconductor device according to the first embodiment in that in the latter the device isolation film 32a formed in the usual device isolation regions is formed of the liner film of the silicon oxide film 18 and the silicon nitride film 20, and the silicon oxide film 28. The semiconductor device according to the present embodiment is different from the semiconductor device according to the first embodiment in that in the former, a device isolation film 32c formed in a capacitor formed region is formed of a silicon oxide film alone and includes no liner film of a silicon nitride film.

Charged carriers are often trapped in silicon nitride film or in the interface of silicon nitride film/silicon oxide film. Accordingly, as exemplified in FIG. 11, when charges are injected into the silicon nitride film 20 due to hot carrier phenomena, photo excitation, or temperature and electric field takes place, there is a risk that charges (e.g., electrons: e$^+$) stored in the silicon nitride film 20 may invert the parasitic channel beneath the trench bottom. At this time, the charges stored in the storage node of the memory cell, e.g., on the left side of the drawing flows into the storage node of the memory cell on the right side of the drawing, having no charges, and their memories may be inverted to each other.

Accordingly, depending on the depth of the device isolation trenches and the device isolation pitches, it may be difficult to prevent the leakage current caused by the liner film of the silicon nitride film.

Then, in the semiconductor device according to the present embodiment, the device isolation film 32c in the capacitor formed region is formed of a silicon oxide film alone, whereby the storage of charges in the device isolation film and the formation of the leakage path in the trench bottoms are suppressed. The deice isolation film 32a formed in the usual device isolation regions is formed of the liner film of the silicon oxide film 18 and the silicon nitride film 20, and the silicon oxide film 28, whereby the mechanical stress exerted by the device isolation film can be suppressed in this region, and the device characteristics can be improved.

Next, the method for fabricating the semiconductor device according to the present embodiment will be explained with reference to FIGS. 12A to 15B.

First, in the same way as in, e.g., the method for fabricating the semiconductor device according to the first embodiment shown in FIGS. 2A to 3B, the structure up to the silicon nitride film 20 is formed.

Figure 12A:
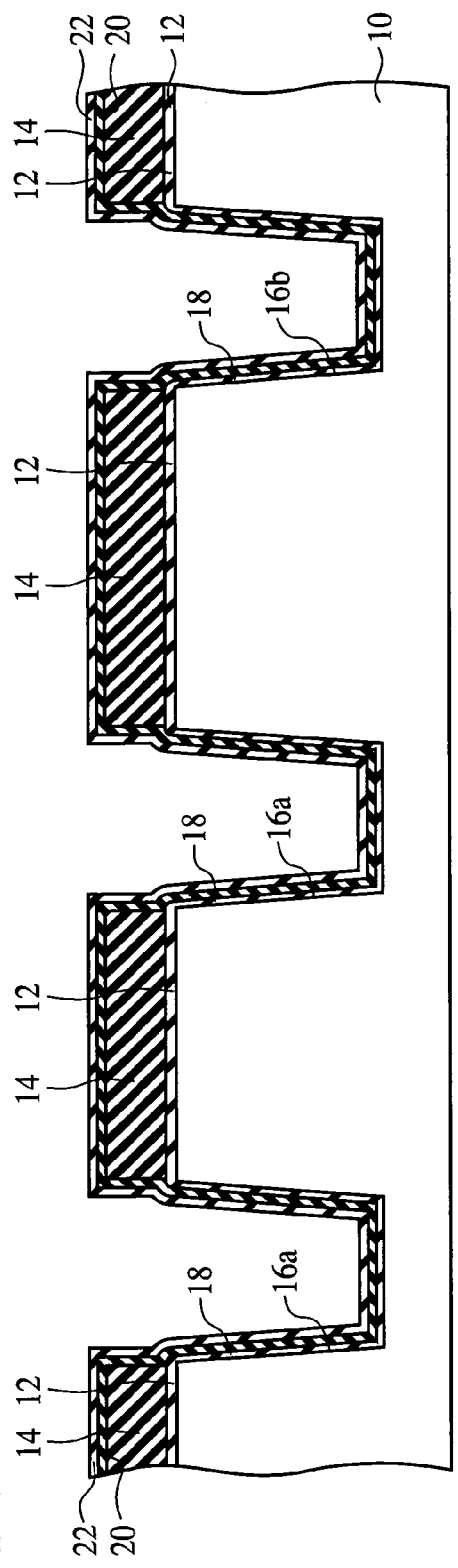

Then, a silicon oxide film 22 of, e.g., a 20 nm-thick is formed on the silicon nitride film 20 by, e.g., CVD method (FIG. 12A). The silicon oxide film 22 is to be used as the mask for etching the silicon nitride film in a later step. Accordingly, the silicon oxide film 22 is thick enough to stand the etching of the silicon nitride film 20.

Then, a photoresist film 24 exposing the device isolation region in the region where a capacitor is to be formed in is formed by photolithography.

Figure 12B:
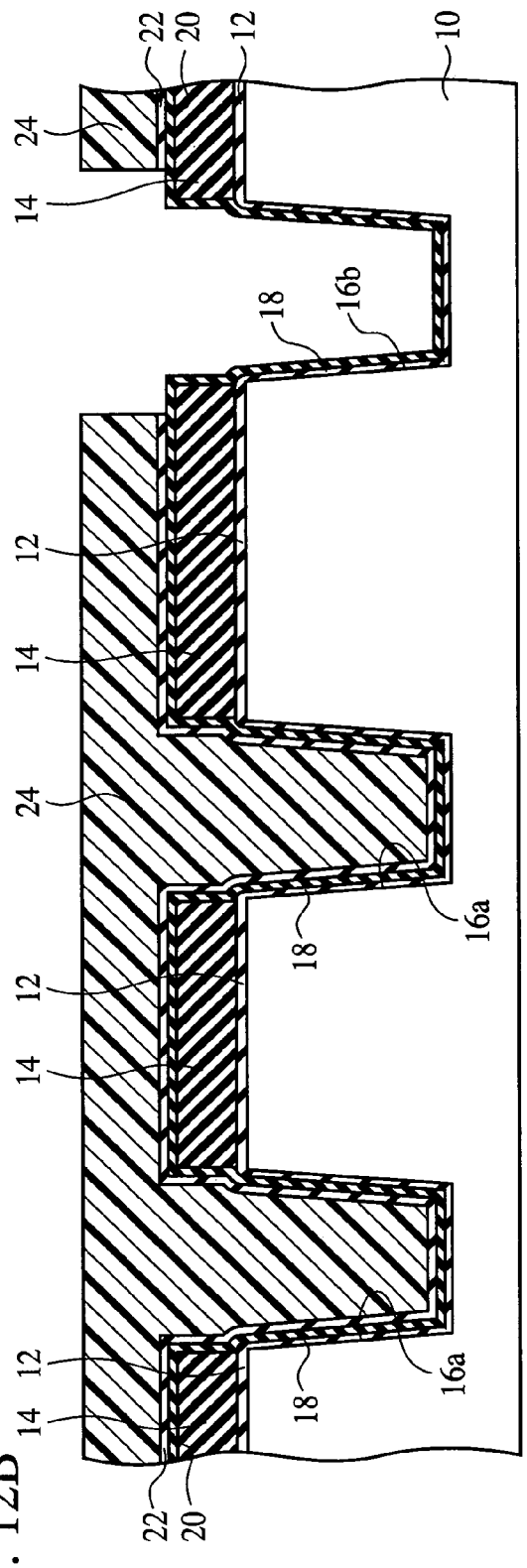

Then, with the photoresist film 24 as the mask and the silicon nitride film 20 as the stopper, the silicon oxide film 22 is etched to remove the silicon oxide film 22 selectively in the region where the capacitor is to be formed (FIG. 12B).

Then, the photoresist film 24 is removed. At this time, the region for the capacitor to be formed in is covered with the silicon nitride film 20. The rest region is covered with the silicon oxide film 22. Accordingly, the silicon oxide film 18 in the region for the capacitor to be formed in and the silicon nitride film 20 in the rest region are kept from being damaged when the photoresist film 24 is removed. That is, a string of steps shown in FIGS. 12A and 12B which are added to the method for fabricating the semiconductor device according to the present embodiment little influence the characteristics of the other elements.

Next, with the silicon oxide film 22 as the mask and the silicon oxide film 18 as the stopper, the silicon nitride film 20 is etched to selectively remove the silicon nitride film in the region for the capacitor to be formed in (FIG. 13A).

Next, with the silicon nitride films 20, 14 as the mask, the silicon substrate 10 is thermally oxidized to form a silicon oxide film 26 of, e.g., a 10 nm-thick on the inside wall of the trench 16b.

Then, a silicon oxide film 28 of, e.g., a 500 nm-thick is deposited by, e.g., CVD method (FIG. 13B). Thus, the silicon oxide film 28 is filled completely in the trenches 16a, 16b.

Figure 14A:
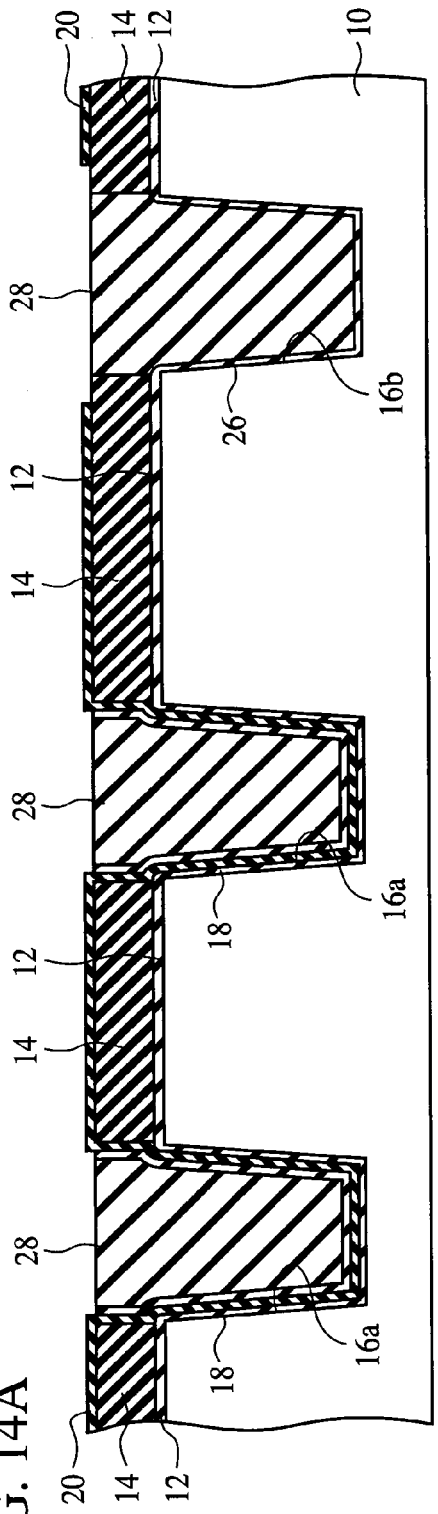

Next, the silicon oxide films 28, 22 on the silicon nitride films 20, 14 are removed by, e.g., CMP method or RIE method (FIG. 14A).

Then, thermal treatment is performed in a nitrogen atmosphere, e.g., at 1000° C. for 30 seconds to increase the film density of the silicon oxide film 28 buried in the trenches 16a, 16b.

Next, a photoresist film 30 exposing the device isolation region defining the region for the capacitor to be formed in is formed by photolithography.

Next, with the photoresist film 30 as the mask, the silicon oxide films 28, 26 are etched to remove parts of the silicon oxide films 28, 26 buried in the trench 16b.

Figure 14B:
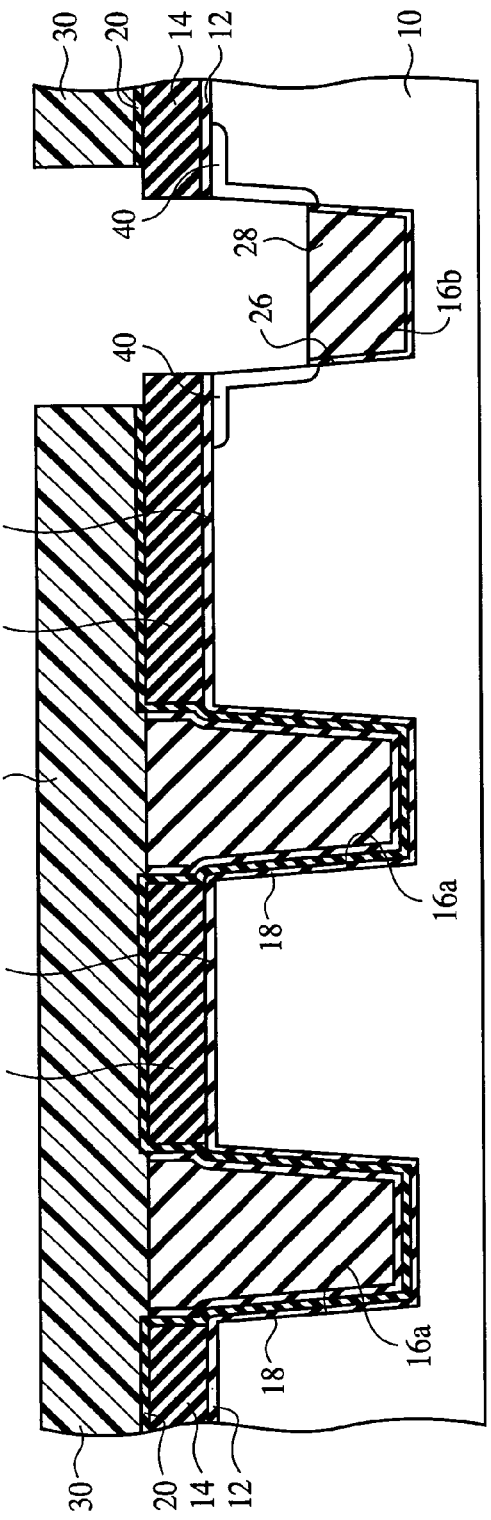

Then, ion implantation is performed with the photoresist film 30 as the mask to form, in the silicon substrate 10 in the region for the capacitor to be formed in, an impurity diffused region 40 which is to be the lower electrode of the capacitor (FIG. 14B). Ions are implanted into the impurity diffused region 40 in at least 2 directions tilted by 20° or more to the normal to the substrate under conditions of, e.g., B$^+$, 10 keV acceleration energy and $8\times10^{12}$ cm$^{-2}$ dosage. This ion implantation can implant sufficient ions in the surface of the substrate 10, which are in the region where the photoresist film 30 is absent, and also in the side walls of the trench 16b.

Then, after the photoresist film 30 has been removed, the silicon nitride films 20, 14 are removed by, e.g., boiled phosphoric acid. Thus, in the trench 16a, the device isolation film 32a of the silicon oxide film 18, the silicon nitride film 20 and the silicon oxide film 28 is formed. Also in the trench 16b, the device isolation film 32c of the silicon oxide film 26 and the silicon oxide film 28 is formed, and the trench 16c is left on the device isolation film 32c (FIG. 15A).

Next, the silicon oxide film 12 is etched by wet etching with hydrofluoric acid-based aqueous solution to expose the surface of the silicon substrate 10 in the device region (FIG. 15B).

Then, in the same was as in, e.g., the method for fabricating the semiconductor device according to the first embodiment shown in FIGS. 6B to 9, the semiconductor device is completed.

As described above, according to the present embodiment, the device isolation film in the capacitor formed region does not include the liner film of the silicon nitride film, whereby the leakage of charges between adjacent memory cells with the device isolation film formed therebetween can be prevented, whereby the inversion of the stored information in these memory cells can be prevented.

Modified Embodiments

The present invention is not limited to the above-described embodiments and can cover other various modifications.

For example, in the first embodiment described above, in the step shown in FIG. 5A, the impurity diffused regions 40 are formed by using the photoresist film 30 used in removing apart of the silicon oxide film 28 in the region for the capacitor to be formed in, but the impurity diffused regions 40 may not be formed essential by this step.

Figure 16:
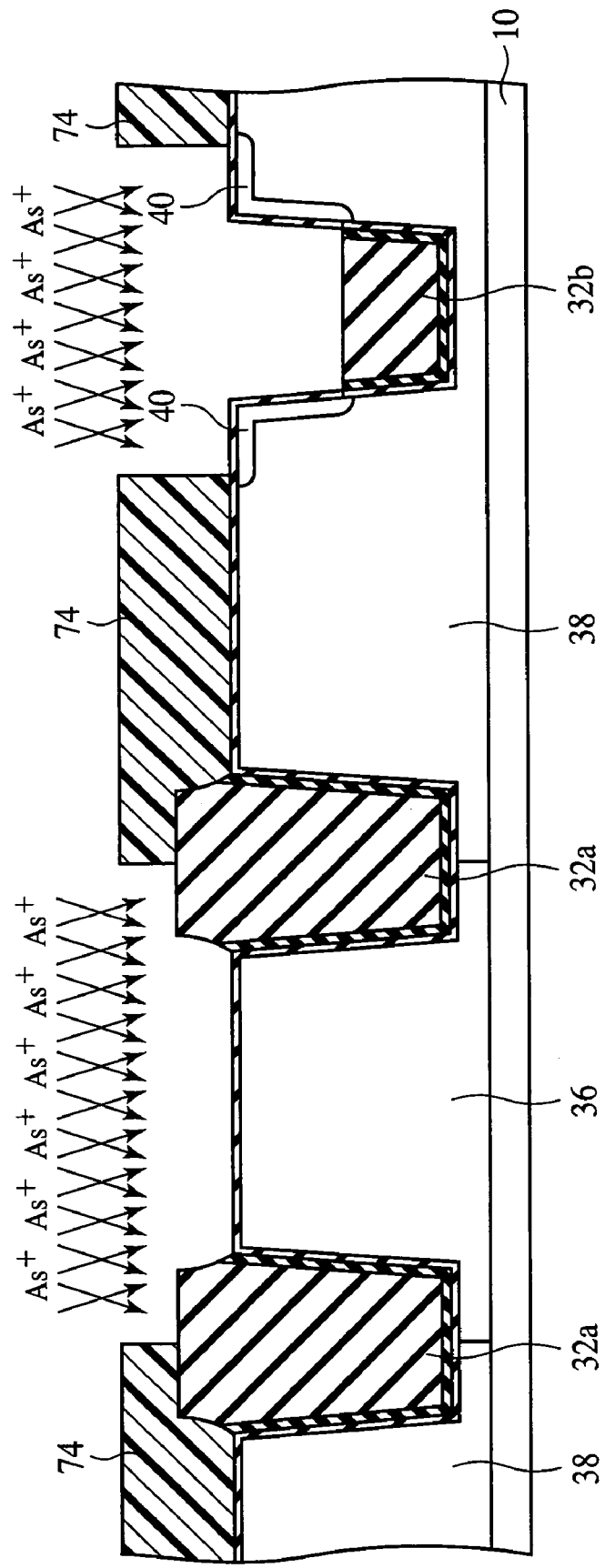
FIG. 16 is a sectional view of the semiconductor device according to one modification of the embodiments of the present invention in the step of the method for fabricating the same, which shows the method.

For example, in the step shown in FIG. 6B, by using as the mask the photoresist film 74 as shown in FIG. 16, which exposes the region for the capacitor to be formed in and the regions for the p-channel transistors to be formed in, channel ion implantation is performed in the regions for the p-channel transistor to be formed in while forming the impurity diffused region 40 in the region for the capacitor to be formed in. Otherwise, a separate step of forming the impurity diffused region 40 may be provided. In these cases as well, the ion implantation must be performed in at least 2 directions tilted by 20° or more to the normal to the substrate so as to implant the ions sufficiently also in the side walls of the trench 16b.

In place of forming the impurity diffused layer 40, a voltage is applied to the capacitor electrode 46 to form an inversion layer in the substrate, and this inversion layer may be used as the electrode.

Figure 17:
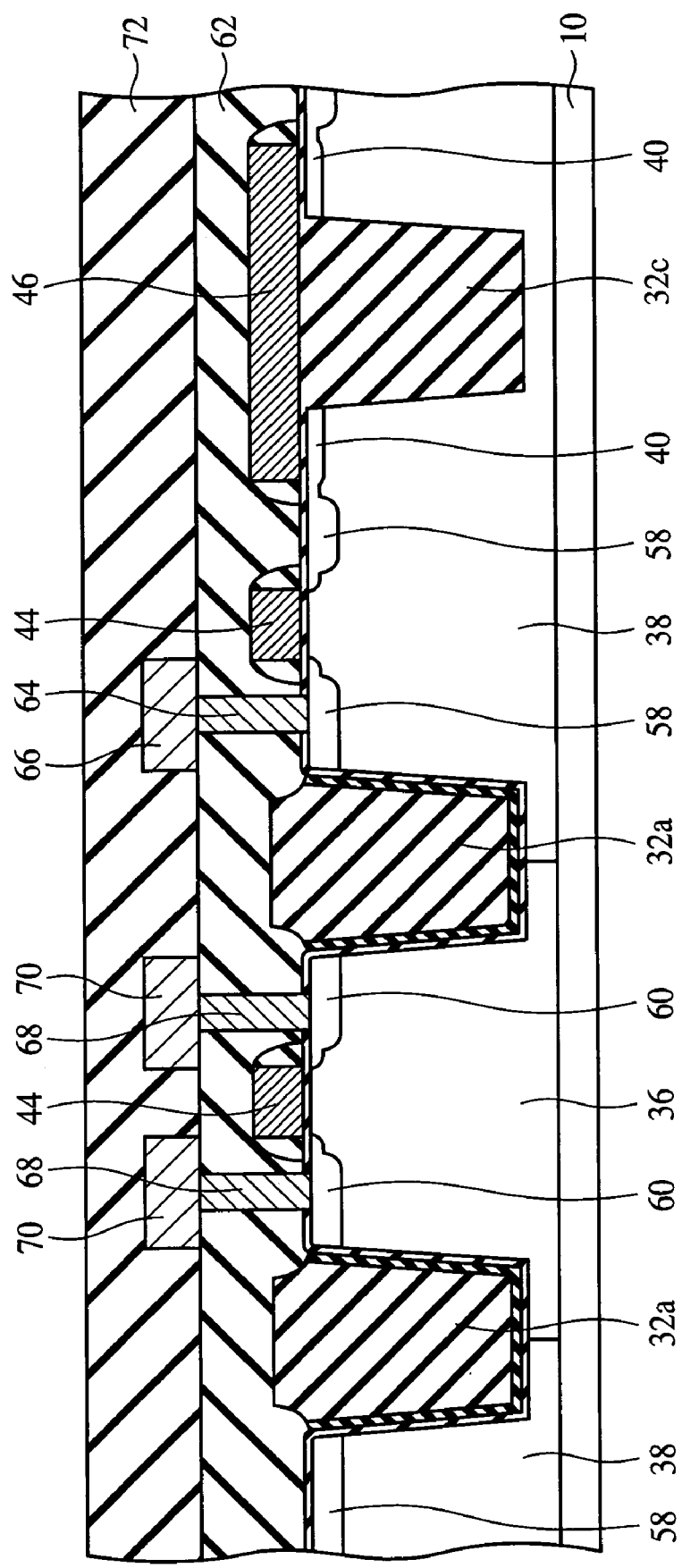
FIG. 17 is a diagrammatic sectional view of the semiconductor device according to another modification of the embodiments of the present invention, which shows the structure thereof.

In the second embodiment described above, the trench 16c is formed on the device isolation film 32c in the region for the capacitor to be formed in, and the capacitor electrode 46 is extended from the inside of the trench 16c onto the surfaced of the silicon substrate 10. However, the trench 16c may not be essentially formed. For example, as described in FIG. 17, the upper surface of the device isolation film 32c and the surface of the silicon substrate 10 may be made substantially flush with each other.

In the case that the device isolation film includes the liner film of the silicon nitride film, charges are stored in the device isolation film, and even when the device isolation film has sufficient isolating ability for the logic LSI, the device isolation film cannot make the memory retaining time sufficient in the devices, such as a dynamic memory, which are sensitive the leakage. On the other hand, in the structure shown in FIG. 17, charges are not stored, and the structure can have sufficient charge retaining ability. Thus, the present invention is applicable to the structure in which the side walls of the trench is not used in the capacitor.

In the above-described embodiments, the memory cell has a p-channel access transistor but may be an n-channel access transistor.

What is claimed is:

1. A semiconductor device comprising:
   a semiconductor substrate with a first trench and a second trench formed in;
   a first device isolation film which includes a liner film formed along an inner surface of the first trench and including a silicon nitride film, and an insulating film of a silicon oxide-based insulating material buried in the first trench with the liner film formed in;
   a second device isolation film which includes a liner film formed along an inner surface of the second trench and including a silicon nitride film, and an insulating film of a silicon oxide-based insulating material buried in the second trench with the liner film formed in, wherein the liner film of the second trench is formed in a bottom part of the second trench; and
   a capacitor formed on a side wall of the second trench above the bottom part, which includes an impurity diffused region as a first electrode formed in the semiconductor substrate, a capacitor dielectric film of a silicon oxide-based insulating material formed on the side wall of the second trench, and a second electrode formed on the capacitor dielectric film.

2. A semiconductor device according to claim 1, wherein the second device isolation film is formed of a silicon oxide-based insulating material.

3. A semiconductor device according to claim 1, further comprising:
   an access transistor including a gate electrode formed over the semiconductor substrate with a gate insulating film interposed therebetween, and source/drain regions formed in the semiconductor substrate on both sides of the gate electrode, one of the source/drain regions being electrically connected to the first electrode of the capacitor.

4. A semiconductor device according to claim 3, wherein the capacitor dielectric film and the gate insulating film are formed of the same insulating layer, and
   the second electrode of the capacitor and the gate electrode of the access transistor are formed of the same conducting layer.

* * * * *